(12) United States Patent
Boutros et al.

(10) Patent No.: US 8,982,986 B2
(45) Date of Patent: Mar. 17, 2015

(54) METHOD AND DEVICE FOR CODED MODULATION

(75) Inventors: Joseph Boutros, Paris (FR); Marc Moeneclaey, Pinte (BE); Dieter Duyck, Leuven (BE)

(73) Assignee: Universiteit Gent, Ghent (DE)

( * ) Notice: Subject to any disclaimer, the term of this patent is extended or adjusted under 35 U.S.C. 154(b) by 15 days.

(21) Appl. No.: 13/821,289

(22) PCT Filed: Sep. 7, 2011

(86) PCT No.: PCT/EP2011/065430
§ 371 (c)(1),
(2), (4) Date: Apr. 5, 2013

(87) PCT Pub. No.: WO2012/032074
PCT Pub. Date: Mar. 15, 2012

(65) Prior Publication Data
US 2013/0215996 A1    Aug. 22, 2013

(30) Foreign Application Priority Data

Sep. 8, 2010   (EP) ..................................... 10175708

(51) Int. Cl.
*H04L 27/00*    (2006.01)
*H03M 13/11*    (2006.01)
*H03M 13/25*    (2006.01)
*H03M 13/29*    (2006.01)
*H03M 13/00*    (2006.01)
*H04L 1/00*    (2006.01)
*H04L 27/26*    (2006.01)

(52) U.S. Cl.
CPC ....... *H04L 27/0012* (2013.01); *H03M 13/1102* (2013.01); *H03M 13/255* (2013.01); *H03M 13/258* (2013.01); *H03M 13/2957* (2013.01); *H03M 13/6325* (2013.01); *H04L 1/0009* (2013.01); *H04L 1/0041* (2013.01); *H04L 1/0058* (2013.01); *H04L 27/2601* (2013.01)
USPC .............. 375/295; 370/252; 375/298; 398/25

(58) Field of Classification Search
None
See application file for complete search history.

(56) References Cited

PUBLICATIONS

J. Boutros, et al.: "Low-density parity-check codes for nonergodic block-fading channels", pp. 1-30, (Feb. 2, 2008).
D. Duyck, et al.: "Rotated modulations for outage probability minimization: a fading space approach", PROC., IEEE International Symposium on Information Theory, ISIT 2010, IEEE, Piscataway, NJ. USA, pp. 1061-1065 (Jun. 13, 2010).
A. Ashikhmin, et al.: "Design of Low-Density Parity-Check Codes for Modulation and Detection", IEEE Transactions on Communications, IEEE Service Center, Piscataway, NJ. USA, vol. 52, No. 4, pp. 670-678 (Apr. 1, 2004).
J. Boutros: "Diversity and coding gain evolution in graph codes", Information Theory and Applications Workshop, 2009, IEEE, Piscataway, NJ, USA, pp. 34-43 (Feb. 8, 2009).
G. Fabregas, et al.: "Coding in the block-erasure channel", 7th Australian Communications Theory Workshop 2006, pp. 19-24 (May 8, 2006).
International Search Report for PCT/EP2011/065430, Oct. 19, 2011.

*Primary Examiner* — Adolf Dsouza
(74) *Attorney, Agent, or Firm* — Bacon & Thomas, PLLC

(57) ABSTRACT

A method for optimising a coded modulation scheme with a given spectral efficiency for communication over a fading channel represented/identified by B fading gains, where B is an integer number expressing the ratio between a code word duration and the duration over which the fading remains constant. The fading gains belong to a B-dimensional space of fading gains.

14 Claims, 10 Drawing Sheets

METHOD AND DEVICE FOR CODED MODULATION

FIELD OF THE INVENTION

The present invention generally relates to the field of digital communication systems. More in particular, it deals with coded modulation techniques for slow fading communication channels.

BACKGROUND OF THE INVENTION

In a digital communication system the transmitter takes information bits to be communicated and converts them into a form suitable for transmission to the receiver. This is performed by encoding (protecting) information bits at the transmitter with an error correcting code and subsequently mapping the coded bits to a sequence of symbols. The symbols are then transmitted over a communication channel to a receiver. The receiver captures the channel output and tries to recover the information bits. Hence, a practical transmission scheme is described by an error-correcting code and means for performing a mapping function.

The channel considered in the context of the present invention includes fading experienced between the transmitter and the receiver and Gaussian distributed noise added to the signal at the receiver. In many applications, such as frequency-hopping schemes (GSM, EDGE), the channel model is a block fading (BF) channel, where for example due to a delay-constraint, a transmitted packet is affected by a limited number of channel states, each subject to independent flat fading. The BF channel can be represented by B fading gains, where B is an integer number expressing the ratio between a code word duration and the duration over which the fading remains constant. Other applications include cooperative communications, multiple input multiple output (MIMO) slow fading channels and frequency-selective channels combined with OFDM, . . . .

In communications the application often requires a transmission at a certain spectral efficiency with a certain quality of transmission. These requirements can be achieved by any transmission scheme, but at a certain price, i.e., the transmitted energy per information bit. It is the aim of any communication engineer to minimize the required energy for a certain quality of transmission and a certain spectral efficiency. One measure for the quality of transmission and hence for the performance of the applied communication scheme is the word error rate (WER), which is the fraction of the total number of transmitted packets (i.e. code words) which has not been decoded correctly at the receiver. An important factor of the WER is the diversity order d, because the WER is inversely proportional to the signal-to-noise ratio (SNR) to the power d. When the maximum diversity order is obtained, one says that the coded system achieves full diversity. The maximum diversity order obtainable over a slow fading channel with B fading gains is B. The average word error rate performance of a communication system has an information-theoretical lower bound determined by the outage probability limit. In order to approach this lower bound, full-diversity should be achieved. Further, the horizontal SNR gap between the outage probability and WER must be decreased as much as possible.

Capacity-achieving codes, such as turbo codes and low-density parity-check (LDPC) codes are well known in the art, see e.g. the handbook *Modern Coding Theory* by T. J. Richardson and R. L. Urbanke, Cambridge University Press, 2008. Many excellent capacity-achieving codes are known for standard channels, such as the additive white Gaussian noise (AWGN) channel. However, few capacity-achieving codes are known for the BF channel. In order to approach the outage probability limit as closely as possible, it is needed to optimize the parameters of capacity-achieving codes.

Binary LDPC codes are powerful capacity-achieving linear error-correcting codes. Linear error-correcting codes are completely determined by their parity-check matrix H of dimension N−K×N. Random LDPC codes have at least one sparse low-density parity-check matrix and the number of ones in a row, resp. column, follow a certain distribution. The fraction of ones in the matrix, being in a column with i ones, is given by $\lambda_i$. The fraction of ones in the matrix, being in a row with i ones, is given by $\rho_i$. Hence, LDPC codes are parameterized by two polynomials $$\lambda(x) = \sum_{i=2}^{d_b} \lambda_i x^{i-1};$$

$$\rho(x) = \sum_{i=2}^{d_c} \rho_i x^{i-1}$$

$$\text{where } \sum_{i=2}^{d_b} \lambda_i = \sum_{i=2}^{d_c} \rho_i = 1,$$

and where $d_b$ and $d_c$ are the maximum number of ones per column and per row, respectively. LDPC codes satisfying the degree distributions $\lambda(x)$ and $\rho(x)$ are said to belong to the same ensemble of LDPC codes. Note that many different parity-check matrices, denoted as instances, can verify the same distributions $\lambda(x)$ and $\rho(x)$. However, when the block length N goes to infinity, the WER performance of all these different instances converges exponentially fast to a value which only depends on the degree distributions. For a specific code instance, the parity-check matrix can be graphically represented by a bipartite graph, denoted as a Tanner graph, displaying bit nodes or variable nodes at the left side and check nodes at the right side. Each bit node has $d_b$ edges connected to it and each check node has $d_c$ edges connected to it. In practice, this graph has cycles and is not a tree.

A constraint valid for all full-diversity codes is the coding rate $R_c$, which is limited by the Singleton bound (e.g. $R_c \leq 0.5$ when B=2). Next, depending on the error-correcting code type, additional requirements may be needed to obtain full-diversity. For example, root LDPC codes (as presented in the paper "*Low-Density Parity-Check Codes for Nonergodic Block-Fading Channels*" (J. J. Boutros et al., IEEE Trans. Information Theory, vol. 56, no. 9, pp. 4286-4300, September 2010)), special semi-random LDPC codes, are full-diversity LDPC codes.

The above-mentioned Boutros paper introduced a new family of LDPC codes, called root LDPC codes, that achieve full-diversity on block fading (BF) channels. However, these root LDPC codes are different from standard random LDPC codes and therefore, the traditional tools for coding gain optimization, such as standard EXIT charts, cannot be directly used for root LDPC codes. In another paper by Boutros ("*Diversity and coding gain evolution in graph codes*", Information Theory and Applications (ITA), San Diego, 2009) it was proved that full-diversity standard random LDPC codes do not exist for the maximum coding rate, given by the Singleton bound.

However, full-diversity standard random LDPC codes may exist for coding rates close to the maximum coding rate.

Furthermore, near full-diversity standard random LDPC codes for maximum rate may also exist. Codes achieving near full-diversity are defined as codes whose WER is inversely proportional to the SNR to the power d, where d equals the maximum diversity order and as long as the error rate is larger than a certain error rate of interest. For example, codes may achieve this maximum decrease in error rate with SNR for word error rates greater than $10^{-4}$, which may be sufficient for most applications. Consequently, there is a need for a method for optimizing the code parameters of standard random LDPC codes in the context of BF channels, so that the WER is minimized.

The optimization technique here above can yield codes that approach the outage probability very closely, for a given modulation. However, using multidimensional modulations with linear precoding, the outage probability associated with a discrete input alphabet can be minimized. Furthermore, the Singleton bound is modified when using precoding, so that full-diversity can be achieved for larger coding rates. The design of multidimensional modulations has been extensively studied for uncoded transmission schemes. In some recent work coded transmission schemes have been studied.

The paper "*Rotated Modulations for Outage Probability Minimization: a fading space approach*" (D. Duyck et al., Intl Symposium on Information Theory, Austin, Tex., USA, June 2010, pp. 1061-1065) deals with the effect of linear precoding on the outage probability. In the paper the size M and the multidimensional shape of the constellation are determined so that the outage probability of a block fading channel with a discrete input approaches the outage probability of a block fading channel with continuous Gaussian distributed input very closely. A continuous Gaussian distributed input yields the smallest outage probability. Hence, as stated in the conclusions of the paper, a close to optimum theoretical lower bound is provided. The labelling of the multidimensional constellation and the design of error-correcting codes with linear precoding are still to be elaborated.

Consequently, there is a need for a method for finding an improved LDPC coded modulation scheme with given spectral efficiency for communication over block fading channels. Such method may serve in cases with or without precoding, and may also be a basis for the design of practical coded systems in other scenarios, such as MIMO channels and cooperative communications. Further, there is a need for a transmitter device with a coded modulation scheme having parameters so configured that the coding gain of practical schemes is improved.

Optimizations of coded modulations with LDPC codes for Gaussian channels are known in the art. For Gaussian channels, whereby the fading gain is not random and remains constant all the time, codes and mapping exist so that the theoretical lower bound (i.e. the channel capacity) is approached closely. The paper "Design of Low-Density Parity-Check Codes for Modulation and Detection" (ten Brink et al., *IEEE Trans. Comm.*, vol. 52, no. 4, pp. 670-678, April 2004) studies a coding and modulation technique where the coded bits of an irregular low-density parity check code are passed directly to a mapper. The code is optimized by performing a curve fitting on extrinsic information transfer (EXIT) charts. Design examples are given for an additive white Gaussian noise (AWGN) channel. The authors mention it is not known how to optimize these coded modulations for fading channels, in other words, how to take into account the randomness of the fading gain. Also, it was stated in the Ph.D. thesis of A. Guillén i Fàbregas ("*Concatenated codes for block-fading Channels*", EPFL, June 2004), that EXIT charts are not a suitable tool for studying error performance on BF channels. This is the reason why the authors in the Boutros paper "*Low-Density Parity-Check Codes for Nonergodic Block-Fading Channels*" did not know how to optimize the degree distributions of LDPC codes for BF channels, and therefore simply simulated the performance of many state of the art codes, to conclude they don't perform well on the BF channel. Next, the authors introduced a new family of LDPC codes, achieving full-diversity, but the degree distributions of this family were never optimized either.

As no solution for standard random LDPC codes on slow fading channels is available, codes and mappings well performing for the Gaussian channel have sometimes been used on the slow fading channel. The performance is poor, because the solution is not adapted to the context. Also root LDPC codes are used on the BF channel. However, they have not been extended and simulated for other coding rates than $R_c=0.5$. Furthermore, linear-time encoding with root LDPC codes is not trivial and standard optimization techniques, such as EXIT charts, have not been modified yet for root LDPC codes. Finally, off the shelf standard random LDPC codes cannot be used, which increases the implementation cost of root LDPC codes for chip designers.

The authors of the above-mentioned ten Brink paper on LDPC codes are also the inventors of the digital transmission system and method disclosed in U.S. Pat. No. 6,662,337. The invention describes the turbo principle in iterative joint demapping and decoding with soft values where the output of the demapper is an input for the decoder and vice versa. It also proposes two mappings that are mixed adaptively dependent on the channel conditions and the number of iterations to be used. The applied criterion for best mapping is performed for Gaussian channels.

AIMS OF THE INVENTION

The present invention aims to provide a method for optimizing a coded modulation scheme with a given spectral efficiency for communication over a slow fading channel, so that the optimal theoretical lower bound (i.e. the outage probability) is better approached than in prior art solutions. It further aims to provide a transmitter device configured according to such optimized coded modulation scheme.

SUMMARY

In a first aspect the present invention relates to a method for optimising a coded modulation scheme with a given spectral efficiency for communication over a channel with slow fading. The slow fading channel is represented by B fading gains, where B is an integer number expressing the ratio between a code word duration and the duration over which the fading remains constant. The observed fading gains form components of a fading point in the B-dimensional Euclidean space of fading gains. The method comprises the steps of:
- selecting a coded modulation scheme having a coding rate, $R_c$, and comprising a mapping with a modulation rate, $R_m$, in accordance with said given spectral efficiency,
- choosing a constellation in accordance with the modulation rate $R_m$,
- labelling the constellation,
- selecting a low-density parity check (LDPC) code ensemble represented by a plurality of code parameters,
- determining the code parameters in accordance with the coding rate $R_c$ whereby at least the degree distributions of a parity check matrix of the low-density parity check code ensemble are optimized so that the code performance of the LDPC code ensemble is optimized in the B-dimensional Euclidean space of fading gains in one or more fading points corresponding to one or more fading points on a predetermined lower bound where the mutual information between input and output of said fading channel equals said spectral efficiency, at least one of said fading points having at least two different (i.e. unequal) components, whereby at least one specific instance of the low-density parity check code ensemble is obtained.

As the code parameters are determined by optimizing the code performance in at least one point in the Euclidean space of fading gains (i.e. the 'fading space') that has two or more non-equal components, the randomness of the fading gains is taken into account. A predetermined lower bound called the outage boundary can be defined as a set of fading points where the mutual information equals the spectral efficiency. The outage probability is the probability that an outage event occurs, i.e. that the mutual information is below the spectral efficiency. The code parameters—at least comprising the degree distributions of a parity-check matrix—are so selected that code performance in said one or more fading points in the fading space, corresponding to one or more fading points on the outage boundary, approaches the predetermined theoretical lower bound (as calculated in the prior art paper by Duyck et al.). A corresponding fading point considered for code performance optimisation can be construed as a fading point in the neighbourhood of the fading point on said theoretical lower bound. The code performance is typically expressed in terms of word error rate, i.e. the fraction of the transmitted packets (code words) that has not been decoded correctly by the receiver.

Note that at least one fading point considered for optimising the code performance must have at least two unequal components. Indeed, if only a fading point with equal components on all axes of the fading space were considered, the channel would be a Gaussian channel and not a fading channel.

The invention so teaches how a coded modulation scheme can be improved for a slow fading channel. Hence, the limitation of prior art solutions like the above-mentioned ten Brink paper is solved, as the randomness of the fading gains can now be dealt with. Further, the above-mentioned root LDPC codes, which take into account two symmetrical fading points with unequal components (so guaranteeing full-diversity), but which do not have optimized degree distributions, can now be optimized thanks to the present invention.

In the proposed method the coding rate $R_c$ and the modulation rate $R_m$ are selected in accordance with the given spectral efficiency. This means that one makes sure the product $R_c \cdot R_m$ equals the spectral efficiency.

The mapping modulates $R_m$ coded bits to one or more symbols. A suitable constellation is chosen and then this constellation is labelled, i.e. each point of the constellation is linked to a certain bit sequence.

In a next step a low-density parity check (LDPC) code ensemble is selected, which is characterised by a set of parameters.

In one embodiment the mapping is one-dimensional, i.e. the coded bits are mapped to a single real or complex transmitted symbol. In this case an optimised coded modulation scheme can be obtained by optimising the code parameters. Note that the considered fading point does not change the choice of labelling in this case.

In a preferred embodiment the mapping is a multidimensional mapping. The components of the multidimensional symbols are the real or complex symbols to be transmitted. The method then advantageously comprises a step of optimising the labelling in the one or more fading points in the fading space considered in the step of determining the code parameters.

In a more particular embodiment optimising the labelling is performed via a step of segmenting the projection of the constellation points on each of its dimensions in clusters and performing a partial labelling whereby a same bit combination is assigned to all points of a same cluster.

In an advantageous embodiment the multidimensional mapping comprises a linear precoding step. In a further preferred embodiment a rotation angle is optimized in said linear precoding step.

In another advantageous embodiment the step of determining the code parameters is performed in B+1 fading points. The B+1 fading points then preferably comprise B fading points on the B axes of the B-dimensional fading space, i.e. one fading point on each axis. In one preferred embodiment B equals two.

Advantageously the step of determining the code parameters is performed by means of extrinsic information transfer charts. Alternatively, the use of density evolution can be envisaged.

In a preferred embodiment the method comprises a step of determining a specific instance of the low-density parity check matrix so that the code performance for codes of finite code word length generated by said specific instance is optimized. This determining step can for example be performed by progressive edge growth (PEG) techniques or by random selection. In an advantageous embodiment, however, the determined specific instance is so selected that it is avoided that information bits belong to a stopping set consisting of bits of which the transmission is affected by a single fading gain of the B fading gains. A stopping set is a subset of variable nodes of said specific instance whereby all neighbours of the subset are at least twice connected to the subset.

In another embodiment the method comprises a step of computing said predetermined lower bound in said one or more corresponding points. The so obtained information can be applied while determining the code parameters that yield a code performance approaching these calculated lower bound value(s).

In another aspect the invention relates to a transmitter device for use in communication over a fading channel according to a coded modulation scheme having a coding rate, $R_c$, and a modulation rate, $R_m$, in accordance with given spectral efficiency. The fading channel is represented by B fading gains, B being an integer number expressing the ratio between a code word duration and the duration over which the fading remains constant. The fading gains form components of a fading point belonging to a B-dimensional space of fading gains. The transmitter device comprises encoding means arranged for encoding applied information bits with a low-density parity check code, modulation means arranged for mapping coded bits output by the encoding means to symbols of a constellation chosen in accordance with the modulation rate, said constellation being labelled, and is characterised in that the code parameters of the low-density parity check code are determined in accordance with the coding rate, whereby at least the degree distributions in the parity-check matrix of the LDPC code are optimized, so that the code performance is optimized in the B-dimensional space of fading gains in one or more fading points corresponding to one or more fading points on a lower bound where the mutual information between input and output of said fading channel equals said spectral efficiency, at least one of the fading points having at least two different (i.e. unequal) components.

In a preferred embodiment the transmitter device further comprises means for performing a linear precoding.

The invention also relates to a communication system comprising a transmitter device as described.

DETAILED DESCRIPTION OF THE INVENTION

In one aspect the invention describes a method for obtaining a coded modulation scheme with optimized performance for block fading channels in the sense that it minimizes the transmitted energy per information bit for a certain quality of transmission and a certain spectral efficiency. The solution can be close to optimal, preferably as close as possible, in the sense that it approaches the achievable lower bound (i.e., the outage probability), as determined in the above-mentioned paper by Duyck et al. In the fading space this means that the code boundary must approach the outage boundary as close as possible. This requires designing a good mapping scheme and error-correcting code.

When implementing a practical system approaching this lower bound, one of the challenges is to describe how the labelling from coded bits to modulation points in a multidimensional constellation occurs (M! different labellings exist for an M-point constellation, whereby the notation M! denotes the factorial operation of M, which is equal to $M*(M-1)* \ldots *2*1$). Another challenge is to determine the code parameters that define the error correcting code. Then, a parity-check matrix satisfying these parameters must be determined.

Figure 1:
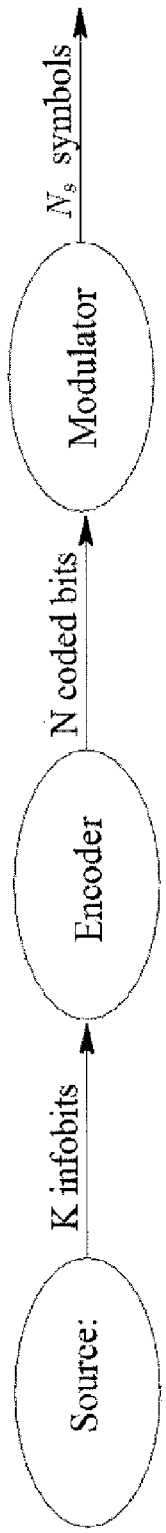
FIG. 1 represents a schematic overview of a transmitter.

In a point-to-point communication model as shown in FIG. 1, a transmitter conveys packets of K information bits to a receiver. First, the transmitter protects the K information bits by adding redundancy through an error-correcting code C(N, K) with code length N. The N coded bits are modulated to $N_s$ symbols in the symbol space. The symbols are transmitted over the channel, hence each symbol corresponds to a channel use, so that the spectral efficiency is $R=K/N_s$ bpcu (bits per channel use). This spectral efficiency can be factorized into the coding rate $R_c$ and the modulation rate $R_m$. The coding rate is equal to the number of information bits per coded bit, $R_c=K/N$, and the modulation rate is equal to the number of coded bits per symbol, $R_m=N/N_s$, so that the overall spectral efficiency is $R=R_cR_m$. Note that the spectral efficiency R also represents the transmission rate.

The $N_s$ symbols are transmitted over the communication channel where they are affected by noise and by fading. At the receiver side an iterative demodulation and decoding of the received symbols is performed in order to detect the transmitted information bits.

In this invention the error-correcting code applied by the encoder (see FIG. 1) is of the LDPC type, for example a systematic binary LDPC code $C[N,K]_2$ with coding rate $R_c=K/N$, block length N and dimension K, defined by a $(N-K) \times N$ parity-check matrix H. A code word is represented by a vector $c=[c_1, c_2, \ldots, c_N]$. Regular LDPC ensembles are characterized by the parameter pair $(d_b, d_c)$, where $d_b$ is the bit node degree (variable node degree) and $d_c$ the check node degree. Irregularity is introduced through the standard polynomials $\lambda(x)$ and $\rho(x)$.

The modulator block of FIG. 1 represents a function $f_N$ that maps the N coded bits to $N_s$ symbols. For the purpose of this description, symbols are assumed to be real symbols. However, it will be apparent to the skilled person that this does not limit the invention and that complex symbols can be employed as well.

$$f_N: \{0,1\}^N \to \Re^{N_s} \qquad (1)$$

whereby $\Re$ denotes the collection of real numbers. The transmitted vector of symbols is represented by $x=[x_1, x_2, \ldots, x_{N_s}]$. In practice, often a modulator block with $N/N_s$ coded bits at the input is used $N_s$ consecutive times to limit the complexity.

$$f: \{0,1\}^{N/N_s} \to \Re \qquad (2)$$

However, also multidimensional modulations can be used, which means that a group of coded bits is mapped to a group of μ symbols (μ>1).

$$f_\mu: \{0,1\}^{\mu N/N_s} \to \Re^\mu \qquad (3)$$

This can yield a significant performance improvement due to the increased degrees of freedom. For example, it is known that multidimensional modulations yield a performance improvement for multiple-input multiple-output (MIMO) channels and single-input single-output (SISO) channels without block fading.

Focus in the present invention is on communication systems designed for slow fading channels. The fading channel is a good channel model for many wireless applications (for example GSM, EDGE). Slow fading channels are a good fit for urban channels where the transmitter, receiver or objects in between are moving. When travelling over a slow fading channel, the transmitter output is multiplied with a fading gain, which remains constant for a sequence of output symbols.

In fading channels the received symbol is a scaled version of the transmitted symbol x plus additive white Gaussian noise w. The fading gain $\alpha \in \mathfrak{R}^+$ is random, i.e. the real fading gains can take any value with a certain probability. It follows for example, but not necessarily, a Rayleigh distributed probability density function and varies in time. In block fading (BF) channels the fading gain varies slowly in time, so that only a limited number of independent and identically distributed (i.i.d.) fading gains B affect a transmitted sequence of $N_s$ symbols. The integer number B is derived from the ratio between a code word duration (i.e. the duration of $N_s$ symbols) and the duration over which the fading remains constant. The fading gains observed during the transmission of a sequence of $N_s$ symbols are collected in the vector $\alpha = [\alpha_1, \ldots, \alpha_B]$, where each fading gain affects a part of the transmitted vector x. The fading space is considered, which is the B-dimensional Euclidean space of the real fading gains $\{\alpha_1, \ldots, \alpha_B\}$. When transmitting a vector x, a point $\alpha$ in the fading space is observed.

The vector x containing the $N_s$ symbols can be split up into B blocks, each having $N_s/B$ symbols. The transmitted vector can then be rewritten as $x=[x(1)_1, \ldots, x(1)_{N_s/B}, \ldots, x(B)_1, x(B)_{N_s/B}]$, where $x(i)_j$ denotes the j-th component of block i. The fading coefficients are only known at the decoder side where the received signal vector is $$y(b)=\alpha_b x(b)+w(b), b=1, \ldots, B \quad (4)$$

with $y(b)=[y(b)_1, \ldots y(b)_{N_s/B}]$ the received signal vector in block b and $x(b)=[x(b)_1, \ldots, x(b)_{N_s/B}]$ the b-th part of the transmitted vector. The noise vector w(b) contains independent noise samples which are Gaussian distributed, i.e., $w(b)_n \sim N(0,\sigma^2)$ where $\gamma=E[\alpha_b^2]E[|x(i)_j|^2]1/(2\sigma^2)$ represents the average signal-to-noise ratio per symbol, with E the expectation symbol. The fading coefficient $\alpha_b$ is independent and identically distributed (i.i.d.) from block to block. For simplicity, the fading coefficients are assumed to be Rayleigh distributed, with expected value $E[\alpha_b^2]=1$. The fading slowly varies in time, so that each block b is affected by only one fading gain, which remains constant for the whole block. Using time interleaving or frequency hopping, the fading gains on different blocks are independent. The parallel channel model with independent fading gains is also an application of MIMO channels with a specific precoder.

In the remainder of the description the specific example is considered where the number of fading gains is B=2, but all techniques can readily be extended to more fading gains. Taking B=2, the first $N_s/2$ transmitted symbols are affected by the first fading gain $\alpha_1$ and the last $N_s/2$ transmitted symbols are affected by the second fading gain $\alpha_2$.

First, a scenario without linear precoding is considered. The transmission scheme shown in FIG. 1 is used, where the modulator is a standard one-dimensional modulator, mapping a set of coded bits to a real or complex symbol. In this case, the Singleton bound is valid and error-correcting codes can only have full-diversity when $R_c \leq 1/B$, i.e., $R_c \leq 0.5$ for B=2. As proved in the paper by Boutros ("*Diversity and coding gain evolution in graph codes*", Information Theory and Applications (ITA), San Diego, 2009), full-diversity standard random LDPC codes do not exist for the maximum coding rate, given by the Singleton bound. However, one can design near full-diversity codes for maximum coding rate and full-diversity codes for $R_c < 0.5$. Without linear precoding, the choice of the labelling does not change in the different fading points. Therefore only the code parameters are considered.

When linear precoding is applied, not only the code parameters are optimized. In this case, the modulator block not only comprises a mapping to map the coded bits to symbols but also a linear transformation which is applied on the mapped symbols. At the output of the linear transformation one obtains the vector x of precoded symbols that is to be transmitted. The vector of symbols obtained after the mapping is denoted by z. Linear precoding can improve the performance on block fading channels because it takes into account what is known at the transmitter side about the channel, i.e., the fading gain varies every $N_s/B$ symbols.

First the mapping part of the modulator block is considered. The coded bits are mapped to symbols using a known constellation $\Omega_z$, e.g. 8-QAM. As already mentioned, this can be seen as a multidimensional modulation, which means that each multidimensional symbol represents a group of symbols. The different symbols in this group are obtained by taking the different components of this modulation. When $\Omega_z$ has two dimensions, as is the case with 8-QAM, it has a first component taken from the x-dimension and a second component taken from the y-dimension. When the number of fading gains B is 2, the multidimensional constellation contains two dimensions. The multidimensional symbol, also called multidimensional point, is denoted by $z_n$ (n=1 ... $N_s/B$). The number of bits per multidimensional point is $m=\log_2|\Omega_z|$, e.g. m=3 with 8-QAM. Assuming that the transmitter includes an error-correcting code of coding rate $R_c$, the overall spectral efficiency is $R=R_c m/B$ bits per channel use (bpcu).

The second part of the modulator block is a linear precoder. After linear precoding, the vectors $x_n$ (n=1, ..., $N_s/B$), are obtained where each vector belongs to a multidimensional constellation, which is denoted as $\Omega_x$. The symbol vectors $x_n$ can be derived as follows:

$$x_n=Pz_n. \quad (5)$$

The precoding matrix P is taken unitary. In this description real constellations are assumed, hence P is an orthogonal matrix. An s×s real orthogonal matrix has s(s−1)/2 degrees of freedom. When s=2, P is a rotation matrix where the rotation angle θ is the degree of freedom. The identity matrix is a special case of P corresponding to θ=0. For example, $\Omega_z$ is an 8-QAM modulator of two dimensions and $\Omega_x$ then is a rotated version of 8-QAM.

Figure 2:
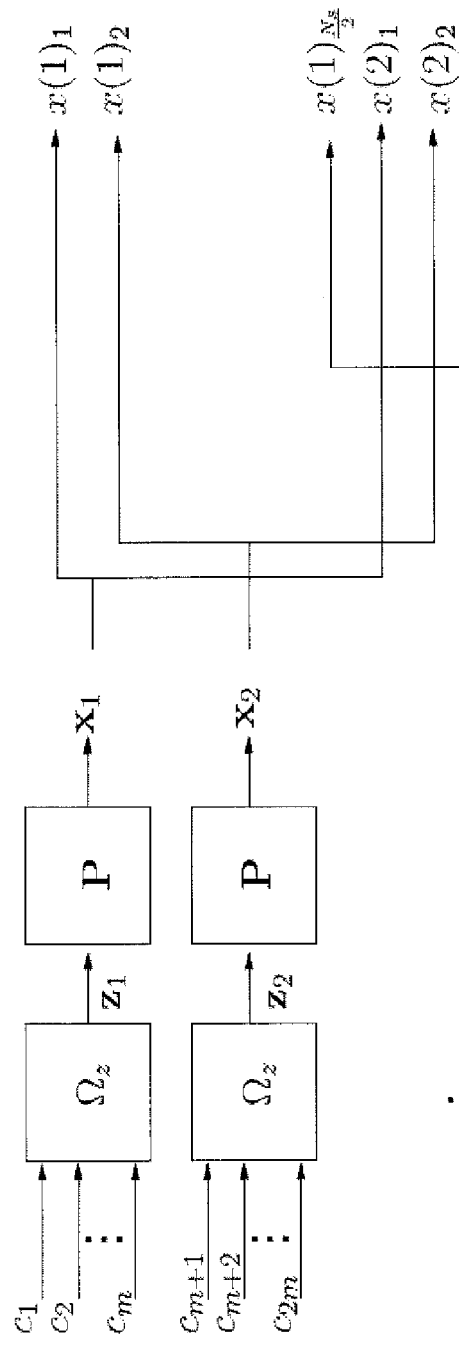
FIG. 2 illustrates the mapping of coded bits to a multidimensional constellation.
Figure 2:
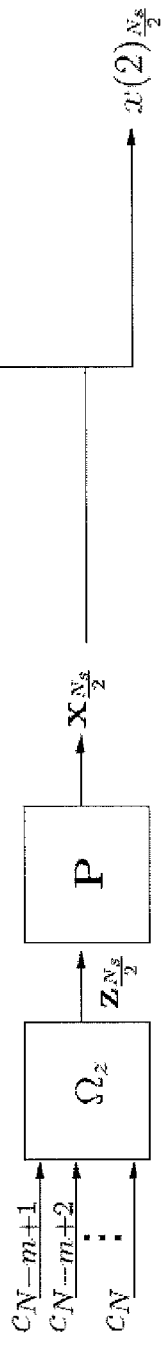

Component interleaving combined with linear precoding can yield important gains in BF channels. Using component interleaving, the components of $x_n$ are placed in the corresponding blocks in x (the first component is put in the first block, the second in the second block and so on). When the number of fading gains B is 2, the multidimensional constellation contains two dimensions. The multidimensional symbol, also called multidimensional point, is denoted by $x_n$, where n represents the index of the components when placed in x, i.e., collecting the different components of $x=[x(1)_1, \ldots, x(1)_{N_s/B}, \ldots, x(B)_1, \ldots, x(B)_{N_s/B}]$, one obtains the vectors $x_n=[x(1)_n, \ldots, x(B)_n]_T$, n=1, ..., $N_s/B$, where each vector belongs to the multidimensional constellation $\Omega_x$ (FIG. 2).

Figure 3:
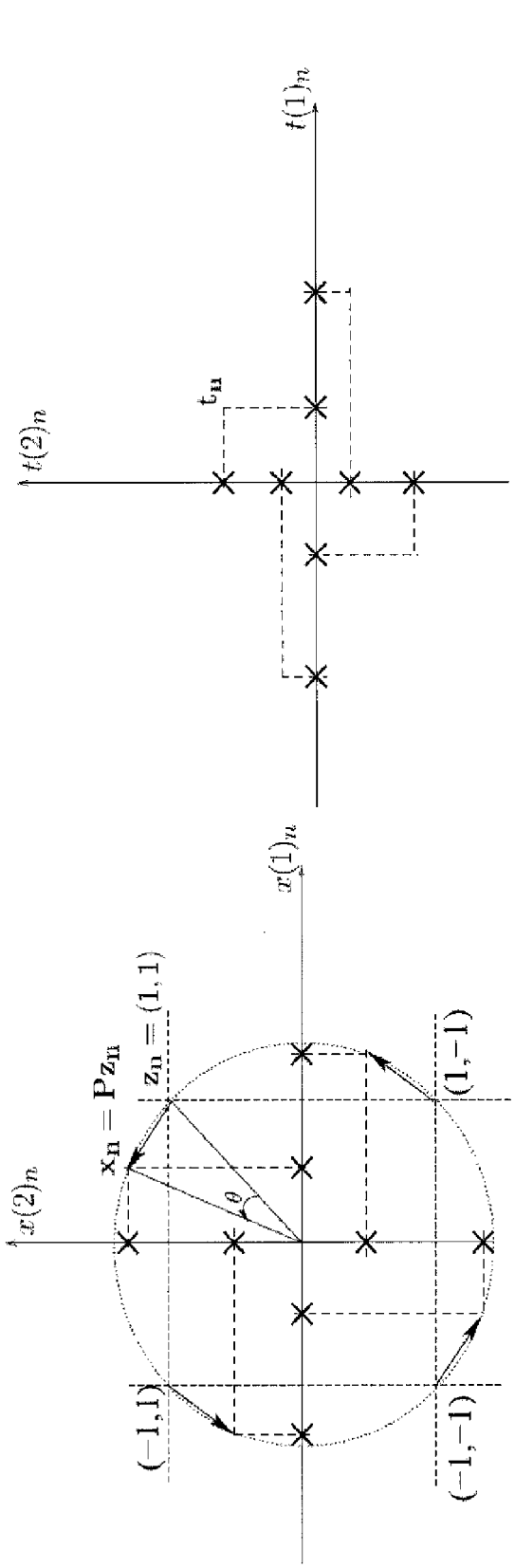
FIG. 3 illustrates the effect of a rotation at the transmitter and at the receiver (without noise), respectively.

FIG. 3 illustrates the effect of a rotation when a 4-QAM modulator is used as $\Omega_z$. The transmitted components are faded by their corresponding fading gain, as expressed by the component-wise multiplication $t_n = a \cdot x_n = [\alpha_1 x(1)_n, \ldots, \alpha_B x(B)_n]$, which is shown at the right side in FIG. 3. The point $t_n = [t(1)_n, \ldots, t(B)_n]$ is shown for a particular fading point $\alpha$. When $\alpha_1 \neq \alpha_2$, the received constellation $\Omega_t$ can be interpreted as the symbols of an unbalanced QPSK constellation (i.e. a constellation whereby both components do not have the same magnitude).

Figure 4:
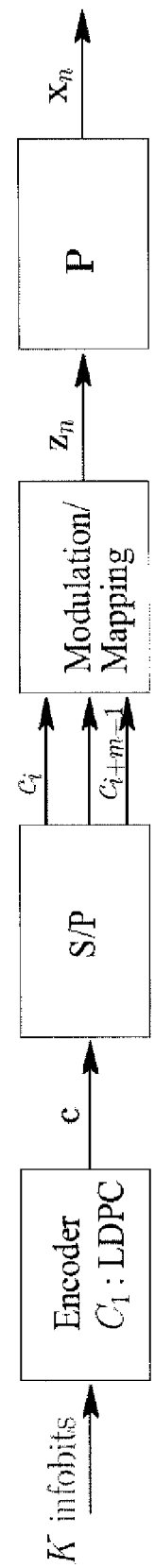
FIG. 4 illustrates a transmission scheme with encoder, mapping and linear precoding block.

FIG. 4 depicts the resulting transmission scheme. The K information bits $[c_1, c_2, \ldots, c_K]$ (because the code is systematic) are encoded into c. Then, c is divided into blocks of length m, which are each converted by the modulator block (comprising a modulator/mapper part and a linear precoding part) to the modulation point $x_n$, $n=1, \ldots, N_s/B$. The mapping from bits to a modulation point is also called labelling. The components of $x_n$, $[x(1)_n, \ldots, x(B)_n]^T$, $n=1, \ldots, N_s/B$, are transmitted on the channel.

Fundamental Theoretical Limits on the Performance of Block Fading Channels

The word error rate (WER) in BF channels is lower bounded by the outage probability $P_{out}(\gamma, R)$, which is the probability that an outage event has occurred. An outage event occurs when the mutual information I between the channel input X and the channel output Y, for a given realization of the fading gains $\alpha$, is smaller than the spectral efficiency R:

$$P_{out}(\gamma, R) = P(I(X;Y|\alpha) < R). \tag{6}$$

An important geometrical tool to design a communication scheme is the fading space. The outage probability and the WER can be calculated in the fading space. When transmitting a sequence of symbols over the channel, a point in the fading space corresponding to the fading gains $\alpha$ is observed. For this observed fading point, it can be determined whether an outage event has occurred. There exists a set of points $\alpha$ so that the mutual information $I(X; Y|\alpha)$ is equal to the spectral efficiency R (which is also the transmitted rate). This set of points is denoted as the outage boundary.

Definition 1 The outage boundary $B_o(\gamma, R)$ corresponds to the set of points $\alpha$ in the fading space, defined by $I(X; Y|\alpha) = R$.

Figure 5:
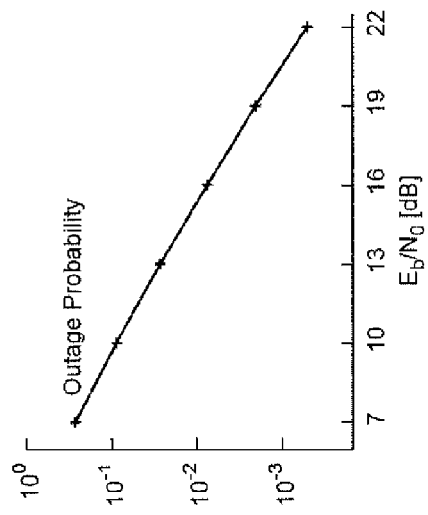
FIG. 5 illustrates an outage boundary delimiting a volume $V_0$ in the fading space. Also the corresponding outage probability is shown.

The outage probability is the probability that the observed fading point falls below this outage boundary:

$$P_{out}(\gamma, R) = \iint_{V_o} p(\alpha) d\alpha, \tag{7}$$

where $V_o$ corresponds to the volume delimited by $B_o(\gamma, R)$. Here, the statistics of the fading $p(\alpha)$, e.g. Rayleigh fading, are taken into account. In FIG. 5, the outage boundary at the left side and the corresponding outage probability at the right side are shown.

Some important points in the fading space can be defined. The intersection between the outage boundary and the axis $\alpha_2 = 0$ is defined as $\alpha_{uo}$ (where uo means unbalanced outage). More precisely it holds that $$I(X;Y|\alpha_1 = \alpha_{uo}, \alpha_2 = 0) = R. \tag{8}$$

The intersection between the outage boundary and the bisector $\alpha_1 = \alpha_2$ (also known as the ergodic line) is defined as $\alpha_{eo}$ (where eo means ergodic outage). More precisely, $$I(X;Y|\alpha_1 = \alpha_2 = \alpha_{eo}]) = R. \tag{9}$$

More generally, a boundary B(V) can be considered in the fading space limiting a volume V. The outage boundary $B_o(\gamma, R)$ corresponds to a volume $V_o$, so that the outage boundary $B_o(\gamma, R) = B(V_o)$.

Now some theoretical results important in the context of linear precoding that already have been presented in the above-mentioned paper by Duyck et al., are briefly repeated.

In the paper rotated modulations for fading channels are studied and optimized to minimize the outage probability. The outage probability on a channel with a discrete input is lower bounded by the outage probability of a channel with a continuous input that is Gaussian distributed. The vertical gap (for a given SNR) between the outage probability between a channel with Gaussian distributed input and a discrete input can be calculated in the fading space. The gap between the outage probabilities is given by $$\text{gap} = \iint_{V_{gap}} p(\alpha_1, \alpha_2) d\alpha_1 d\alpha_2, \tag{10}$$

where $V_{gap}$ is the B-dimensional volume (surface if B=2) between the outage boundary with a discrete input and the outage boundary with a continuous Gaussian distributed input. Therefore, to minimize the gap between the outage probabilities, it is necessary to minimize the size of the volume $V_{gap}$. The outage probability of the channel with a discrete input is minimized by determining the number of points in the multidimensional constellation $|\Omega_x|$ and an interval of the rotation angle $\theta$. However, only the outage probability is considered in the paper.

Figure 6:
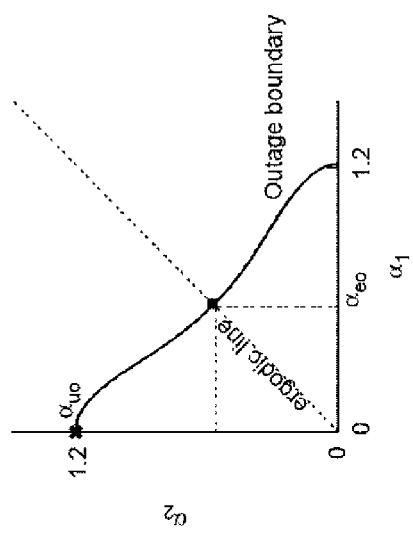
FIG. 6 illustrates a rotated two-dimensional 8-QAM constellation.
Figure 6:
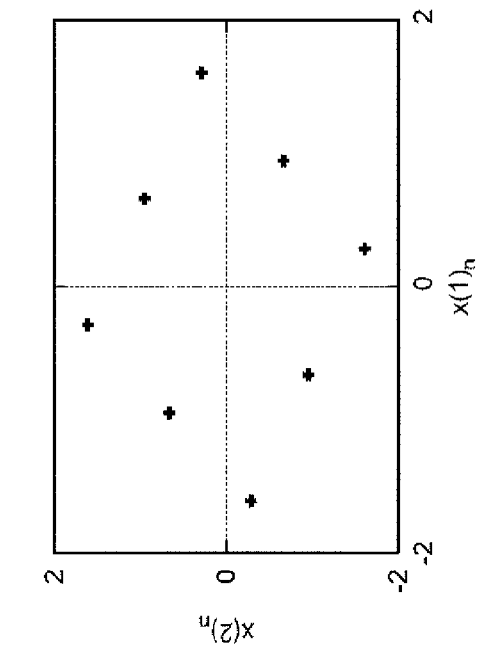
Figure 7:
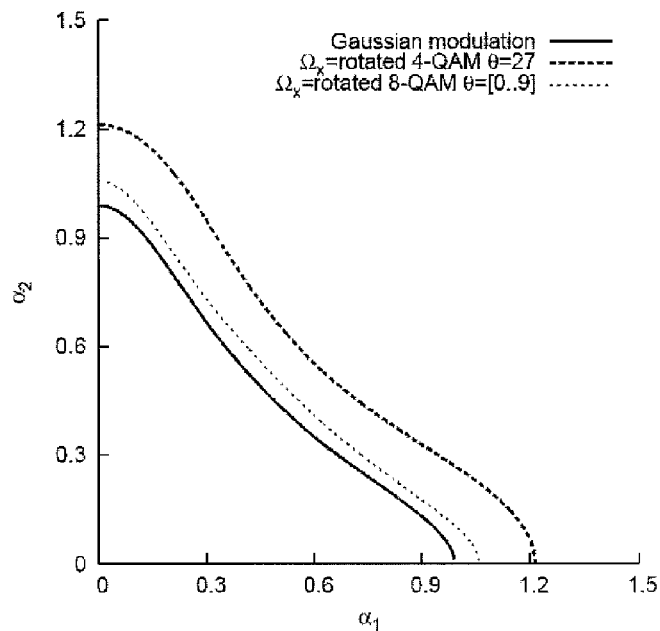
FIG. 7 illustrates the outage boundaries of a constellation with Gaussian input distribution, rotated 4-QAM constellation and rotated 8-QAM constellation in the two-dimensional fading space.

In the paper an upperbound on the outage probability is established. The upperbound only depends on the cases where $\alpha_1 = 0$ or $\alpha_2 = 0$. Therefore, through a one-dimensional optimization the upperbound on the outage probability is easily minimized. It is shown that a constellation expansion together with a rotation angle optimization is sufficient to extremely approach the outage probability with Gaussian distributed continuous inputs. For example, consider a spectral efficiency R=0.9 bpcu. It can be shown that a rotated 8-QAM with $\theta$ in the range $[0, \ldots, 9]$ is sufficient to approach the outage probability with continuous Gaussian distributed input very closely. The rotated constellation is shown in FIG. 6. A constellation expansion and an appropriate rotation are sufficient to decrease $V_{gap}$ considerably, as illustrated in FIG. 7. When the constellation is further expanded, the extra performance gains become smaller so that a limited constellation expansion is sufficient.

Information theory states that the WER of a practical system is lower bounded by the outage probability. Hence, in order to minimize the WER, first its lower bound must be minimized. Therefore, the number of points $|\Omega_z|$ of the multidimensional constellation and the rotation angle interval should be taken as explained in the above-mentioned paper.

In the present invention the code parameters of an error-correcting code of the LDPC type are determined and optionally also the labelling and the rotation angle within the rotation angle interval obtained are specified, so that the code boundary approximates as closely as possible the outage boundary.

Any capacity-achieving code has a code boundary in the fading space.

Definition 2 The code boundary $B_c(\gamma, R)$ limits the volume $V_c$, $B_c(\gamma, R) = B(V_c)$, which corresponds to the set of points $\alpha$ in the fading space where the WER $P_{ew}(\gamma, R)$ is always greater than zero when the block length goes to infinity. The fading points corresponding to the complement of $V_c$ correspond to a WER $P_{ew}(\gamma, R)$ which is arbitrarily close to zero when the block length goes to infinity.

This code boundary can be determined deterministically with numerical tools such as density evolution or EXIT charts. Similar to the calculation of the outage probability from the outage boundary, the WER can be calculated from the code boundary in the fading space:

$$P_{ew}(\gamma, R) = \iint_{V_c} p(\alpha) d\alpha, \tag{11}$$

where $V_c$ corresponds to the volume limited by $B_c(\gamma,R)$. Similar definitions as in previously given for the outage boundary hold for the code boundary.

Definition 3 $\alpha_{uc}$ ('uc' denoting unbalanced code) is defined by the intersection between the code boundary and the axis $\alpha_2=0$.

Definition 4 $\alpha_{ec}$ ('ec' stands for ergodic code) is defined as the intersection between the code boundary and the bisector $\alpha_1=\alpha_2$ (i.e. the ergodic line).

Figure 8:
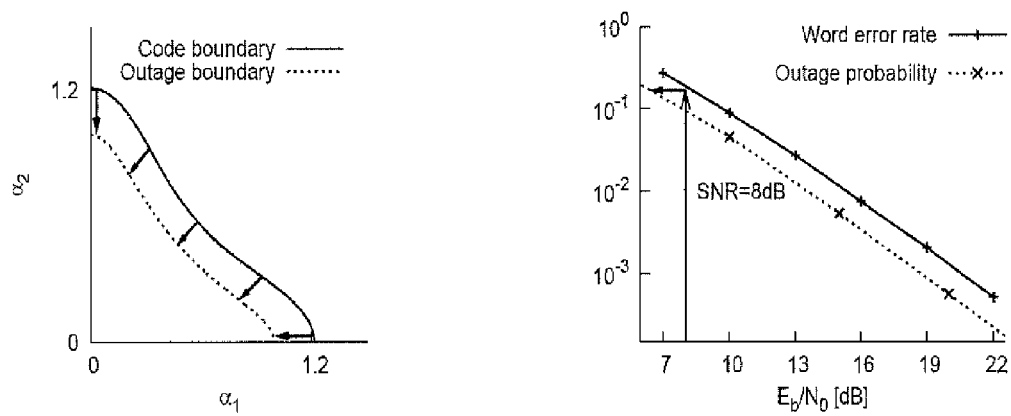
FIG. 8 represents an example of a code boundary and corresponding word error rate.

FIG. 8 provides an illustration. An example of a code boundary in the fading space (left side) and its corresponding word error rate (right side) is shown. The code boundary is always "above" the outage boundary and the word error rate is always larger than the outage probability when the block length goes to infinity. When optimizing the coding gain, the WER will approach the outage probability. In the fading space, this is equivalent to an approach of the code boundary towards the outage boundary, as illustrated by the arrows.

Figure 9:
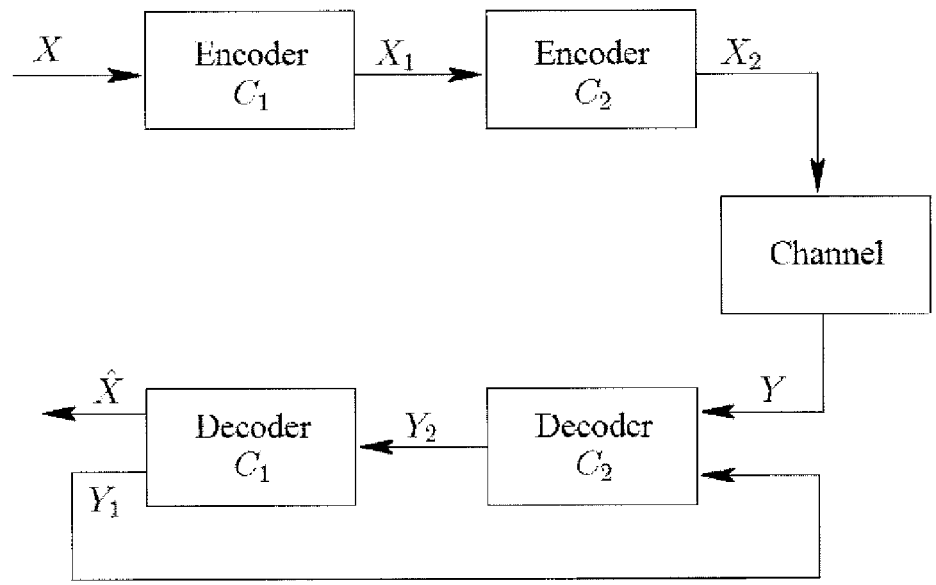
FIG. 9 represents a general encoder/decoder system considered in the framework of EXIT charts.

An extrinsic information transfer (EXIT) chart (see e.g. also the ten Brink paper mentioned in the background section) is used to analyze the behaviour of iterative so-called turbo receivers. In many cases, the decoder can be described as a serial concatenation as shown in FIG. 9. The notation X represents an information bit. A group of information bits is encoded to coded bits, where each coded bit is represented by $X_1$. The symbols transmitted on the channel are denoted by $X_2$. The channel observation Y is processed in the iterative decoder, where the messages $Y_1$ and $Y_2$, carrying a belief about $X_1$, circulate. Finally, a decision X is made. An EXIT chart based on mutual information is a curve with two axes: $I_1=I(X_1;Y_1)$ and $I_2=I(X_1;Y_2)$. Any point of this curve shows that if the knowledge from the previous iteration is $I_1$, using this together with the channel observation $O_c$, the information at the output of decoder $C_2$ would be $I_2$. Hence, this curve can be viewed as a function $I_2=f_E(I_1,O_c)$, where $f_E(.)$ depends on the code as well as on the decoding scheme. For a fixed code, fixed decoding scheme and fixed $O_c$, $I_2$ is a function of just $I_1$ or simply $I_2=f_E(I_1)$. Equivalently, a second EXIT curve can be made for decoder $C_1$, so that the following two functions can be distinguished:

$$I_1=\phi(I_2) \quad (12)$$

$$I_2=\psi(I_1) \quad (13)$$

Figure 10:
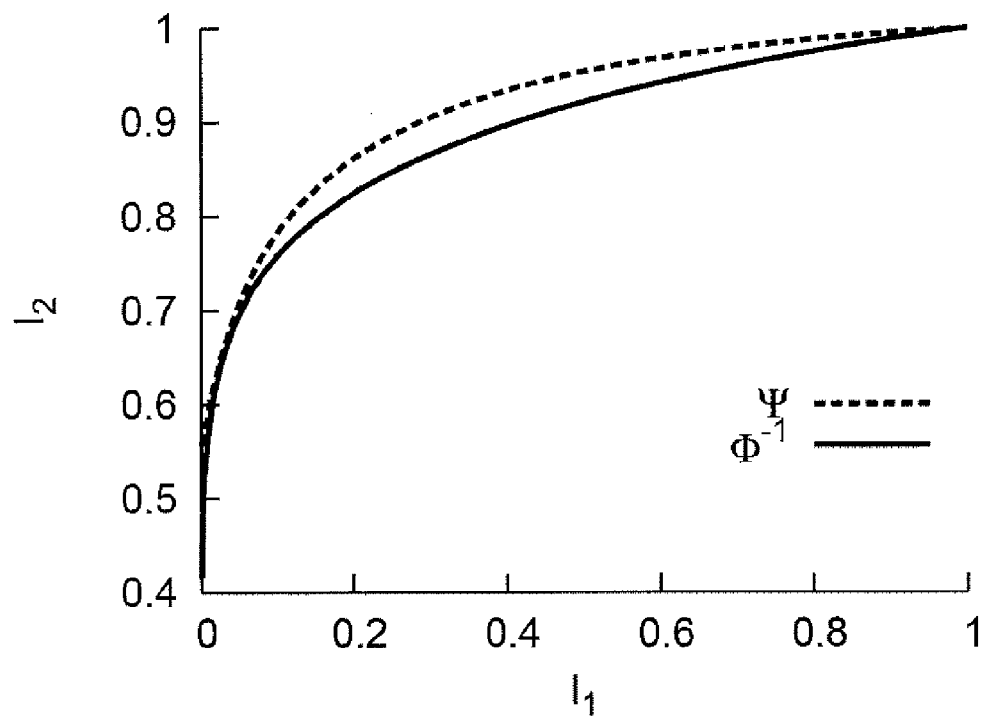
FIG. 10 represents an example of two EXIT curves.

The function $\phi$ is defined by decoder $C_1$ and the function $\psi$ is defined by decoder $C_2$. Now, one can plot the functions $\phi^{-1}$ and $\psi$ in the plane defined by the axes $I_1$ and $I_2$ (FIG. 10). While decoding, the uncertainty about $X_1$ is gradually resolved. Before decoding, $I_1=0$, as no a priori information is known at the receiver. Given the channel observation, $Y_2$ will have some information about $X_1$, $I_2>0$. Next, this information is processed to $Y_1$ through decoder $C_1$, $I_1=\phi(I_2)$, which is processed again to $Y_2$, $I_2=\psi(I_1)$. The iterative decoder converges if both curves do not intersect for $0 \leq I_1<1$ (it is said that "the tunnel is open"), and a decoding success is declared. The code boundary can be found by iteratively finding the worst channel conditions so that the tunnel is open, i.e., so that the above mentioned curves do not intersect.

EXIT charts are an approximation. Between decoder $C_1$ and decoder $C_2$ the probability density functions of the circulating messages are approximated by Gaussian distributions (which simplifies the analysis considerably to a one-dimensional analysis). Therefore, this method is called the all-Gaussian approach. Given the channel conditions, with density evolution (DE) it can be calculated exactly whether a decoding success can be declared. However, DE requires intensive computations and/or a long search. EXIT charts have a much lower computational complexity and a reasonably good accuracy. For fading channels accuracy is less stringent than for Gaussian channels, where capacity is approached at the order of magnitude of 0.01 dB. A more accurate one-dimensional analysis can be applied, wherein the Gaussian approximation is made only once, at the input of decoder $C_2$, instead of two times as in EXIT charts. Only one recurrence equation, $I_{out}=f_{SG}(I_{in})$, is used and compared to the bisector. If the EXIT curve does not intersect with the bisector, a decoding success is declared. While the first approach is called the all-Gaussian method, this more accurate analysis is the semi-Gaussian approach. Both approaches are used below.

The diversity order d is an important factor of the WER because the WER is inversely proportional to the signal-to-noise ratio to the power d. When multidimensional modulations are used together with precoding, the maximum diversity order is obtained by the multidimensional demapper. When no multidimensional modulations are used, the error-correcting code has to achieve the maximum diversity order. One says that full-diversity codes must be used. The optimization process of the parameters of the LDPC code with EXIT charts is also valid in the case that no multidimensional modulations are used. However, some requirements on the coding rate must be satisfied. The optimization however still occurs in at least one fading point with at least two non-equal components.

In the explanation below standard LDPC codes (regular LDPC codes and irregular LDPC codes) are used. However, it should be noted that the invention is in no way limited to this specific type of LDPC codes. For example, also root LDPC codes can be optimized. Generally speaking, the outage probability limit can be approached by any capacity achieving LDPC code. The optimization process in at least one fading point with different components is applicable for any capacity-achieving code. However, depending on the type of LDPC code, the EXIT curve equations can be different. For example, the EXIT-chart framework for root LDPC codes is different than for standard LDPC codes.

When no capacity-achieving codes are used, a different definition for the term 'code boundary' must be used. The code boundary then depends on the block length N of the error-correcting code. Given this definition, the error-correcting code can also be optimized in at least one fading point with different components. Also here, the method for optimization can differ from the method used for LDPC codes.

As already mentioned, in the approach according to the invention the fading space is considered in order to take into account that the fading is random and varies in time. Use of the fading space allows considering multiple values for each fading gain (each dimension) and multiple combinations of different fading gains affecting the same sequence of symbols.

Generally speaking, to minimize the gap between the WER and the optimized outage probability, the code boundary must approach the outage boundary for all points on that boundary, as illustrated at the left side in FIG. 8. The code boundary corresponds to the set of points where the tunnel between the EXIT curves is about to close. It is desired that this boundary approach the outage boundary, i.e., one wants the tunnel to be open for all the fading points just next to the outage boundary. Therefore, in a preferred embodiment multiple optimizations using EXIT charts are performed in different points in the fading space. However, in one embodiment a single point in the fading space is considered for optimization. In a preferred embodiment optimization in three points is performed, as experiments show this yields good results: the unbalanced points $\alpha_1=(\alpha_1=0, \alpha_2=\alpha_{uo}+\epsilon)$ and $\alpha_2=(\alpha_1=\alpha_{uo}+\epsilon, \alpha_2=0)$ and the ergodic point $\alpha_3=(\alpha_1=\alpha_{eo}+\epsilon, \alpha_2=\alpha_{eo}+\epsilon)$, where $\epsilon$ is very small, e.g., $\epsilon=0.1$. If the tunnel in these points is open then it is known that:

$$\alpha_{uo} < \alpha_{uc} \leq \alpha_{uo}+\epsilon$$

$$\alpha_{eo} < \alpha_{ec} \leq \alpha_{eo}+\epsilon \quad (14)$$

One key element of this invention is that the error-correcting code of the LDPC type is optimized in at least one fading point in the fading space so that the randomness of the fading gains is taken into account. In the prior art the code was optimized in only one particular point in the fading space, namely for the combination of the fading gains whereby the components on the B axes of the fading space are all equal. This particular combination constitutes a Gaussian channel, for which the fading gain remains constant all the time. When the fading gain is random and varies over time, another point than the one for a Gaussian channel (and preferably more than one) should be considered in the fading space. So the structural difference between the solution according to the present invention is that it is now understood how to take into account the random fading when optimizing the degree distributions of LDPC code type families. When more than one point is considered, the error-correcting code is optimized for multiple combinations of both fading gains at the same time. Optionally also the mapping function can be determined exploiting the considered fading points.

Another key element of this invention is that when optimizing the LDPC code, at least the degree distributions of a parity-check matrix of the considered LDPC code ensemble are optimized. As already mentioned earlier, in the prior art a family of LDPC codes referred to as root LDPC codes, has been introduced, which performs well in the fading points $\alpha_{uo}$. Due to this feature, root LDPC codes have full-diversity. However, the parameters of this special type of LDPC codes, i.e., the degree distributions, have not been optimized yet. This can be done using the present invention.

A further key element of the invention concerns the selection of a specific code instance satisfying the code parameters as determined. The specific code instance is preferably selected so that the finite code word length performance is optimized.

The system parameters are optimized in one fading point or in multiple fading points. For each point, two EXIT curves can be considered. The already mentioned paper of ten Brink has already shown how to combine a code with a modulator and detector in the EXIT chart framework. The difference is that here the channel is slowly fading and the modulation can be a multidimensional modulation. Remaining problems to be solved are how to design the code, i.e., how to choose good degree distributions and how to design the labelling in the case of precoding, for the BF channel. These problems are tackled by the present invention, as explained in detail below.

Consider again the two EXIT curves for the decoders of FIG. 9.

$$I_1 = \phi(I_2, \rho(x)) \quad (15)$$

$$I_2 = \psi(I_1, \lambda(x), O_c, M) \quad (16)$$

where the dependencies on the design parameters are given. Besides the input mutual information, function $\phi(.)$ only depends on the right degree distribution $\rho(x)$, while function $\psi(.)$ depends on the left degree distribution $\lambda(x)$, the channel observation $O_c$ and the modulation and labelling denoted by M. This means that the function $\phi$ does not change for the different fading points and does not depend on the signal-to-noise ratio.

When optimizing codes often check-regular or right regular LDPC codes, i.e., $\rho(x)=x^{d_c-1}$, are assumed. This simplifies the optimization as the function $I_1=\phi(I_2, \rho(x))$ is completely fixed (only the parameters of the functions $\psi(.)$ have to be varied to open the tunnel). Furthermore, experiments have revealed that check-regular codes perform very close to the optimum, so that it is a safe assumption here. The design criterion then boils down to find the degree distributions $\lambda(x)$ so that the functions $\psi(.)$ corresponding to the multiple fading points are all "above" the function $\phi^{-1}(.)$. Assume that D different variable node degrees are allowed. Then only D−2 edge fractions can be adjusted because two extra constraints are imposed:

$$\sum_i \lambda_i = 1, \quad (17)$$

$$\sum_i \lambda_i / i = \frac{1}{d_c(1-R_c)}, \quad (18)$$

In a preferred embodiment of the invention optimizations in three points are performed: the unbalanced points $(\alpha_1=0, \alpha_2=\alpha_{uc})$ and $(\alpha_1=\alpha_{uc}, \alpha_2=0)$ and the ergodic point $(\alpha_1=\alpha_{ec}, \alpha_2=\alpha_{ec})$, which correspond to three EXIT curves, which are denoted by $\psi_1, \psi_2$ and $\psi_3$, respectively.

Figure 11:
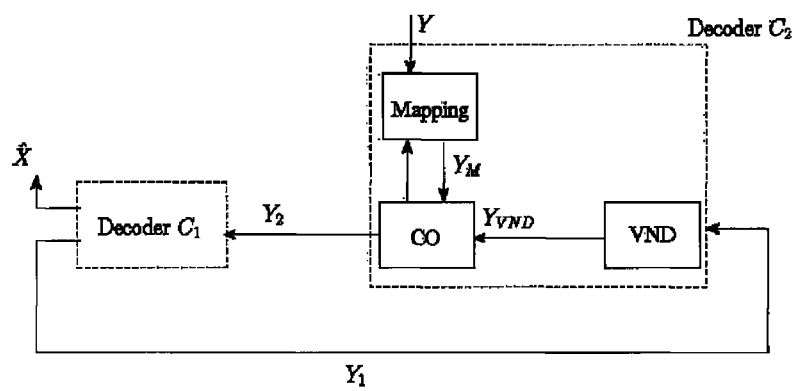
FIG. 11 shows details of decoder $C_2$.

Now the optimization method in a case without precoding is discussed. FIG. 11 details decoder $C_2$. The "VND" block combines, for each coded bit, all information coming from the check nodes in a single variable $Y_{VND}$. The "CO" block combines the information coming from the check nodes, i.e., $Y_{VND}$, with the information coming from the channel, Y. When the beliefs on the coded bits, $Y_1$, $Y_{VND}$ and $Y_2$, represent log-likelihood ratios, then, for each coded bit, the output of CO is a simple addition of all its inputs.

In standard EXIT charts, the probability density functions (pdf) of the variables $Y_1$ and $Y_2$ are approximated as Gaussian distributions. In standard Gaussian channels, the pdf of Y is the same for all coded bits. However, for BF channels without precoding, the channel observation of the first half of the bits has another pdf than the channel observation of the second half of the bits. Hence, the pdf of $Y_2$ is now a mixture of B=2 distributions. Approximating this pdf as a single Gaussian distribution leads to a large error. Therefore, it is proposed to consider $Y_1$ and $Y_{VND}$, instead of $Y_1$ and $Y_2$.

Deriving the optimal degree distribution $\lambda(x)$ corresponds to an optimization problem under constraints, i.e., minimize $\epsilon$ so that the tunnel between the EXIT curves is still open provided that Eqs. (17) and (18) hold, which can be done through linear programming.

Figure 12:
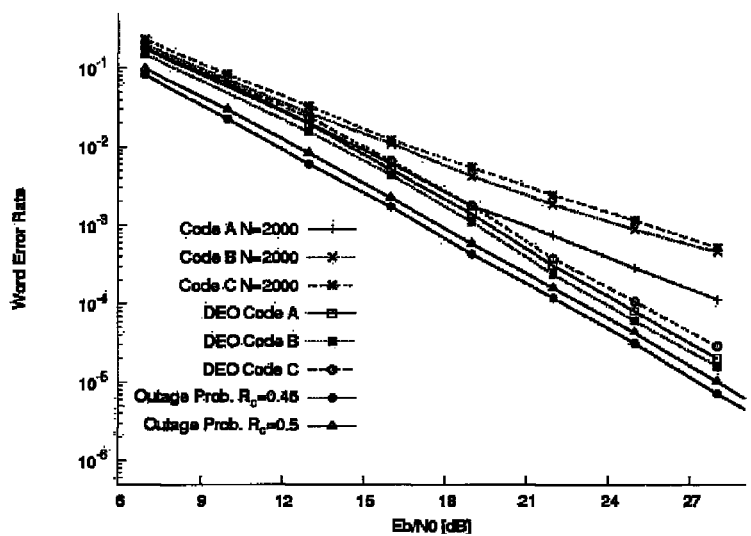
FIG. 12 illustrates the density evolution outage (DEO) and finite length WER performance of the proposed invention for standard random LDPC codes without precoding.

The results in FIG. 12 illustrate the effect of this method. The performance of three codes is verified by means of simulations, see Table 1.

TABLE 1

| | $R_c$ | $\lambda(x)$ | $\rho(x)$ |
|---|---|---|---|
| Code A | 0.45 | $0.499 x + 0.198 x^2 + 0.198 x^5 + 0.1045 x^6$ | $x^4$ |
| Code B | 0.49 | $0.396 x + 0.1766 x^2 + 0.1467 x^3 + 0.1377 x^7 + 0.1426 x^8$ | $x^5$ |
| Code C | 0.50 | $0.422 x + 0.1325 x^3 + 0.445 x^4$ | $x^5$ |

All the curves, labelled by DEO, have (near) full-diversity. DEO stands for the infinite code word length bit error rate performance. Only Code C theoretically cannot achieve full-diversity, but one cannot notice this limitation for practical error rates. However, the finite length (code word length N=2000) performance illustrates that achieving full-diversity at infinite length is not sufficient to achieve full-diversity at finite length.

As mentioned in the handbook *Modern Coding Theory* by T. J. Richardson and R. L. Urbanke, the concentration theorem states that the infinite length performance corresponds to the performance of an LDPC code without cycles. However, at finite length, cycles are inevitable and change the performance. Hence, the specific graph of the LDPC code instance has to be taken into account for the performance of finite length LDPC codes.

Consider the fading points $\alpha_1$ and $\alpha_2$. Half of the bits are erased, just as in an erasure channel. It is proved in the art that the distribution of stopping sets and the degree distributions completely determine the performance of LDPC codes over erasure channels. The definition of stopping sets is recalled. A stopping set is a subset $V_s$ of V, the set of variable nodes, such that all neighbours of $V_s$ are connected to $V_s$ at least twice. The neighbours of a (set of) variable node(s) are the check nodes connected to this (set of) variable node(s). A check node enforces the modulo-2 sum of all bit nodes, connected to it, to be zero. Hence, when LLRs associated to the messages from two bit nodes to a unique check node are zero (i.e., these bit nodes are completely erased and no belief on the value of these bit nodes can be expressed), then this check node is useless and cannot deliver any information to the other bit nodes connected to it. Therefore, if all bits in a specific stopping set are erased (e.g. for $\alpha_1$, belong to the first N/2 bits faded by $\alpha_1$=0), then these bits can never be retrieved by belief propagation (in contrast to ML decoding). For achieving full-diversity at finite length in a BF channel with B=2 blocks, it is necessary that no information bits belong to a stopping set that exclusively consists of bits transmitted on a unique fading block. The reason is that the WER is determined by the fraction of packets where at least one information bit is erroneously decoded. If an information bit belongs to a stopping set that belongs to a unique fading block, then full-diversity cannot be achieved. Indeed, the probability that this stopping set is erased equals the probability that one fading block is erased, which behaves as $1/\gamma$, where $\gamma$ is the average signal-to-noise ratio.

In this invention, a solution is proposed constituting a sufficient condition to avoid information bits being in a stopping set that belongs to a unique fading block. Stopping sets are comprised of multiple cycles (the only stopping sets formed by a single cycle are those that consist of all degree-2 bit nodes), so that maximizing the girth (i.e. the length of the smallest cycle in a graph) also increases the minimum length of stopping sets. A general method, denoted as Progressive Edge Growth (PEG), to construct Tanner graphs with large girth is presented in the paper "*Regular and Irregular Progressive Edge-Growth Tanner Graphs*" (X. Hu et al., *IEEE Trans. on Inf. Theory*, vol. 51, no. 1, pp. 386-398, January 2005). The PEG graphs are constructed in an edge-by-edge manner. All bits are sorted from small to large degree. First, the edges of bits with small degree are placed in the graph. The edge connects a bit node to a check node so that the girth of the graph at that moment in the algorithm remains as large as possible. Hence, the girth of the left-hand subgraph of a symbol $x_n$ decreases slowly for increasing n in PEG graphs. The left-hand subgraph of a symbol $x_n$ consists of the symbol nodes $\{x_1, \ldots, x_{n-1}, x_n\}$, the edges that emanate from them, and the check nodes they are connected to. The girth of the left-hand graph is denoted by left-hand girth. Having a large left-hand girth of lower degree symbol nodes is a nice property inherent to the PEG construction. It is clear that the left-hand girth of $x_2$ is infinity. This remains infinity for a number of symbols while increasing n. Suppose that all information bits are placed in the first K positions. If the first N/2 positions have a left-hand girth of infinity, K≤N/2, then these information bits do not belong to a stopping set that exclusively consists of bits transmitted on a unique fading block. One can now determine the maximum coding rate so that N/2 bits have a left-hand girth of infinity. The fraction of bit nodes having a bit degree of two is denoted by $\check{\lambda}_2$, where $\check{\lambda}_2$ is obtained from $\lambda_2$:

$$\check{\lambda}_2 = \frac{\lambda_2/2}{\sum_i \lambda_i/i}$$

On a BF channel with B=2, $R_c \leq 0.5 - 1/N$ (a rate constraint) is a necessary condition on the coding rate to have no cycles on the first half of bits. Additionally, satisfying $\check{\lambda}_2$ 0.5 while using the PEG construction method is a sufficient condition to avoid cycles on the first half of bits.

Figure 13:
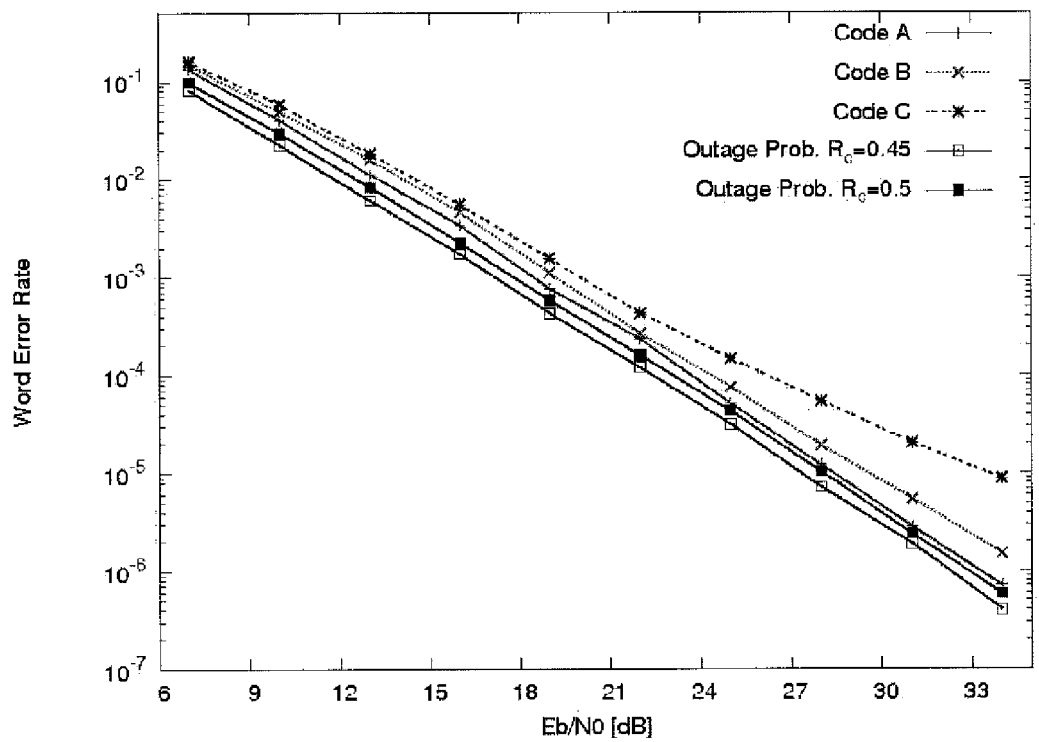
FIG. 13 illustrates the finite length WER performance after applying the proposed techniques to improve the finite length performance.

Codes A and B satisfy the necessary and sufficient condition, which results in a full-diversity performance for finite length (FIG. 13). Code C does not satisfy the rate constraint. Furthermore, it does not achieve full-diversity asymptotically (i.e., at infinite code word length) either.

Now the case with precoding is considered. It can be shown that in EXIT charts for multidimensional LDPC coded modulations the following properties hold for the multidimensional LDPC coded modulations.

The output mutual information of decoder $C_2$, $\psi(I_1=0)$, is independent of the degree distribution $\lambda(x)$ if the input mutual information of decoder $C_2$ is zero.

The output mutual information of decoder $C_2$, $\psi(I_1==1$ if the input mutual information of decoder $C_2$ is one.

This has some important consequences:

Because the output mutual information $\psi(I_1=1)$=it is not important to optimize the system assuming perfect a priori information (i.e. input mutual information equal to 1).

It is advantageous to optimize the system in the phase before decoding, which corresponds to an input mutual information of zero. In this phase, the function $\psi(I_1=0)$ only depends on the labelling and the rotation angle.

These observations lead to the following optimization strategy in case of a multi-dimensional modulation:

First optimize the labelling function and the rotation angle by optimizing the phase before decoding.

Then optimize the degree distributions, so that the tunnel remains open for the worst possible channel conditions.

The system can be optimized with the semi-Gaussian approach similarly as well as with the all-Gaussian approach. In the all-Gaussian approach, the EXIT curves $\psi_1$, $\psi_2$ and $\psi_3$ must remain above the function $\phi^{-1}$ for the worst possible channel conditions. In the semi-Gaussian approach, the EXIT curve $I_{out}=f_{SGi}(I_{in})$, (i=1 . . . 3), must remain above the bisector for the worst possible channel conditions. However, it was noticed experimentally that this more accurate analysis does not yield a lower WER than the all-Gaussian approach for the considered system. Finally, the semi-Gaussian approach analysis can easily be extended to check-irregular codes, but this also does not improve the performance. Therefore, in the further description, the all-Gaussian approach will be used.

Given the spectral efficiency R, the optimal modulation size and an optimal rotation angle interval are given (see Duyck paper). For example, when R=0.9 bpcu, the optimal constellation $\Omega_x$ is a rotated 8-QAM, where $\theta$ in the range of 0 to 9 degrees. Now, a labelling needs to be determined, as well as the final rotation angle within the optimal rotation angle interval. Finding good labelling schemes is generally a hard problem. Mostly, they are determined numerically (brute-force search). General schemes such as for example Gray labelling (optimal for uncoded transmission) and Ungerboeck labelling are well known. However, their performance on the BF channel is poor. A heuristic algorithm is elaborated below providing good labelling schemes for multidimensional modulations on the BF channel.

As mentioned in the previous section, the labelling function and the rotation angle are determined by optimizing the phase before decoding. It is important to optimize this phase to have a good head start while decoding and to facilitate the optimization of the degree distribution. The EXIT curve $\phi^{-1}$ is very steep close to $I_1=0$, so that the degree distributions must be chosen so that the EXIT curves $\psi_1$, $\psi_2$ and $\psi_3$ are also very steep close to $I_1=0$. This leads to a large weight of high degrees which increases the complexity and yields a worse matching of the EXIT curves at higher $I_1$. Therefore, maximizing the value $\psi_1(I_1=0)$ relaxes the requirements on the slope of the EXIT curves at low $I_1$.

As three EXIT curves $\psi_1$, $\psi_2$ and $\psi_3$ are considered, the minimum value $\psi_i(I_1=0)$ of the three EXIT curves is maximized $$\text{Labeling: } \max\left(\min_i(\Psi_i(I_1 = 0))\right) \quad (19)$$

This can be done numerically, with a brute-force search of all $(2^m)!$ possible labelling functions. When m becomes large, this becomes a resource consuming task. Therefore, a heuristic algorithm is described which immediately gives the optimal labelling function.

The labelling must optimize the situation before decoding in the three considered fading points. It is not known which mapping maximizes the mutual information at the output of the demapper, but the tail probability of the probability density function of the message at the output of the demapper is dominant in the calculation of this mutual information. This tail probability also determines the bit error rate, so that Gray mapping (optimal in terms of bit error rate) performs good.

Each fading point is now considered. A labelling is proposed for the constellation of FIG. 6. Each symbol is assigned to a sequence of m=3 bits. The same algorithm can be used for other constellations.

A. Unbalanced Fading Point ($\alpha_1=\alpha_{uc}$, $\alpha_2=0$)

Figures 14, 15:
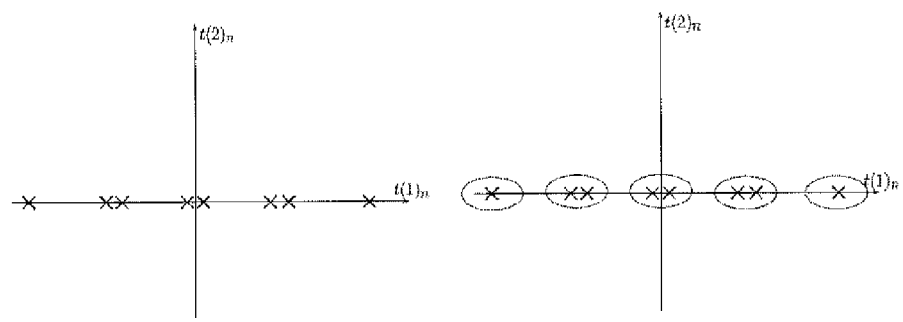
FIG. 14 represents a multidimensional modulation $t_n$. The fading point $(\alpha_1 = \alpha_{uc}, \alpha_2 = 0)$ is applied.
FIG. 15 illustrates the clustering of the multidimensional modulation $t_n$.
Figure 16:
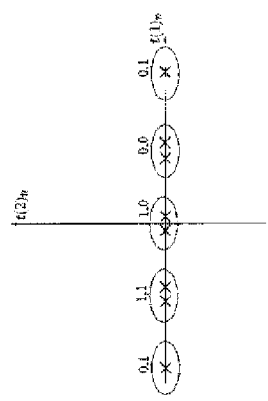
FIG. 16 illustrates the segmented multidimensional modulation $t_n$.labelled in a Gray fashion.

The fading point ($\alpha_1=\alpha_{uc}$, $\alpha_2=0$) corresponds to a smashed constellation on one of its dimensions (see FIG. 14). It is proposed to segment the constellation points in clusters as shown in FIG. 15. Two constellation points which are very close to each other are very likely to be confused when noise is added. Therefore, they are collected in one cluster. Next, the same bit combination is assigned to all points in one cluster, so that no error is made when these points are confused. When m-a bits are assigned to each cluster, a maximum of $2^a$ points are allowed in each cluster. Finally, clusters containing less than $2^a$ points can be assigned to the same bit combination as long as the sum of the number of bits in the clusters assigned to the same bit sequence is smaller than $2^a$. In this example, five clusters are observed where two clusters contain only one point. Therefore, two bits per cluster are sufficient. To minimize the error rate between clusters when noise is added, the labelling is done in a Gray fashion, as shown in FIG. 16 (other Gray labellings are also valid). Note that the two clusters containing only one symbol are assigned to the same bit sequence. The reason for this will become clear further.

B. Unbalanced Fading Point ($\alpha_1=0$, $\alpha_2=\alpha_{uc}$)

Figure 17:
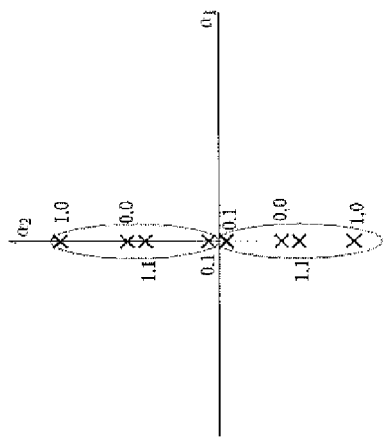
FIG. 17 illustrates a multidimensional modulation $t_n$. The fading point $(\alpha_1 = 0, \alpha_2 = \alpha_{uc})$ is applied.
Figure 18:
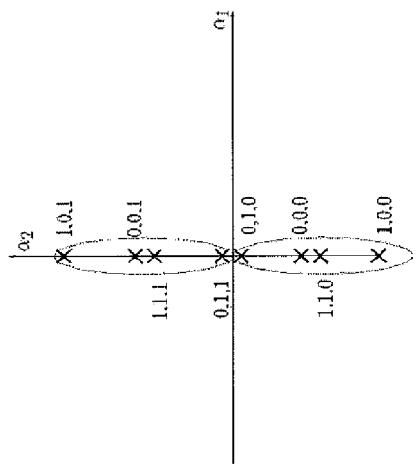
FIG. 18 illustrates the third bit being assigned in a second step in the labeling.

Now the third bit $c_{j+3}$, j=nm needs to be assigned. As only one bit needs to be assigned, two clusters will be distinguished. The fading point ($\alpha_1=0$, $\alpha_2=\alpha_{uc}$) corresponds to a smashed constellation on the other dimension. Taking into account the partial labelling (2 of the 3 bits were assigned in the previous step) of the first step, the smashed constellation is shown in FIG. 17. It is proposed to assign $C_{j+3}=1$ to all the positive symbols and $c_{j+3}=0$ for all the negative symbols (FIG. 18). The third bit only has a high probability of error for the two symbols close to the origin, but there, the first two bits are well protected (due to the same bit sequence assigned previously).

C. Ergodic Fading Point ($\alpha_1=\alpha_{ec}$, $\alpha_2=\alpha_{ec}$)

Figure 19:
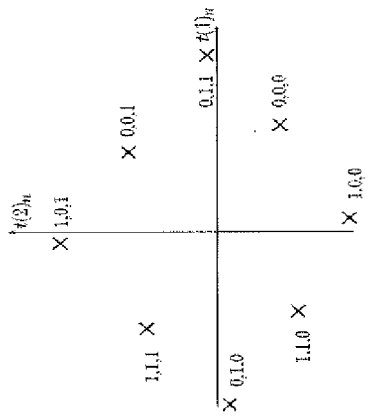
FIG. 19 represents the final labelling on the multidimensional constellation $t_n$. The fading point $(\alpha_1 = \alpha_{ec}, \alpha_2 = \alpha_{ec})$ is applied.

Here the fading point ($\alpha_1=\alpha_{ec}$, $\alpha_2=\alpha_{ec}$) is considered. The constellation with labelling is illustrated in FIG. 19. Each symbol has already been assigned to three bits, using the unbalanced fading points. Considering the Rayleigh fading distribution, the two unbalanced points are more crucial for the WER performance than the ergodic fading point. Furthermore, this strategy yields the same mapping functions as the optimal ones obtained by the brute force search, which means that the obtained labelling s also performs well for the ergodic fading point. Note that the first two bits are Gray mapped, while the third bit is assigned to two well distinguished parts of the modulation plane.

Following this protocol, many different mappings can be found, e.g., by permuting the position of the bits in the proposed algorithm. Which unbalanced fading point is treated first in this algorithm is not important. This mapping is not optimal for the ergodic fading point (the optimal mapping is full Gray mapping), but it is optimal for the proposed criterion (Eq. (19)).

The optimization criterion used to optimize the labelling (Eq. (19)) can be used to optimize the rotation angle within the interval specified by the Duyck paper. This optimization can be done numerically. For the rotated 8-QAM constellation, the optimal rotation angle is $\theta=9$ degrees. Note that for this rotation angle, the minimal distance of the smashed constellations is maximized.

Figure 20:
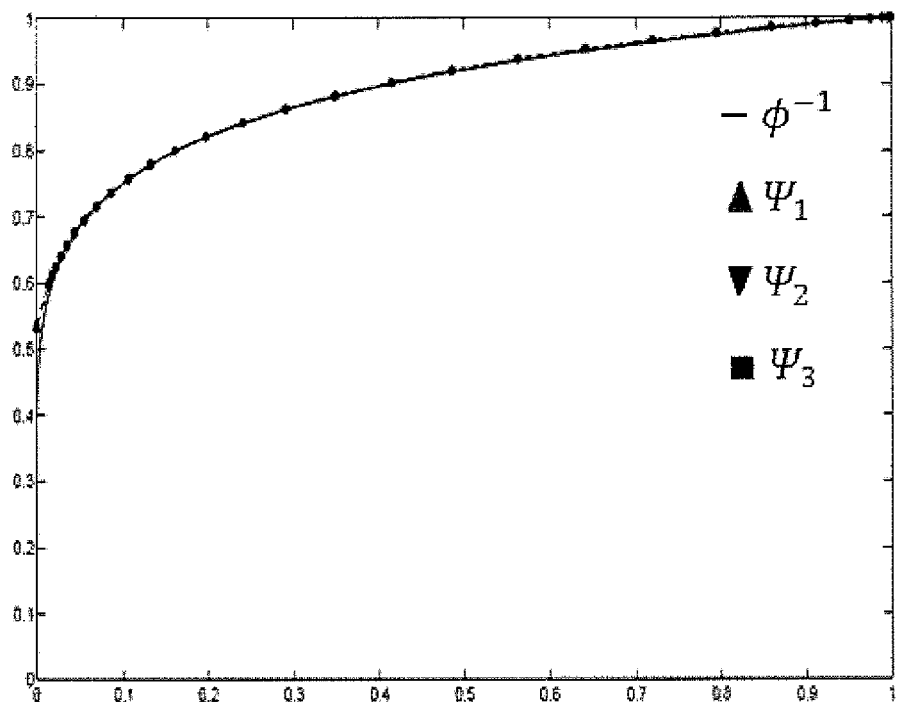
FIG. 20 illustrates the EXIT curves of the functions $\psi_i(i=1, 2, 3)$ and $\Phi^{-1}$. The EXIT curves of the functions $\psi_i$ practically coincide.

In the context of BF channels, one wants to optimize the system in the fading points $\alpha_1$, $\alpha_2$ and $\alpha_3$. Deriving the optimal degree distribution $\lambda(x)$ corresponds to an optimization problem under constraints, i.e., minimize c so that the tunnel between the EXIT curves is still open provided that Eqs. (17) and (18) hold, which can be done through linear programming. The result of this optimization process (FIG. 20) suggests that worse channel conditions would mean that the tunnel would close, because all curves are very well matched.

Figure 21:
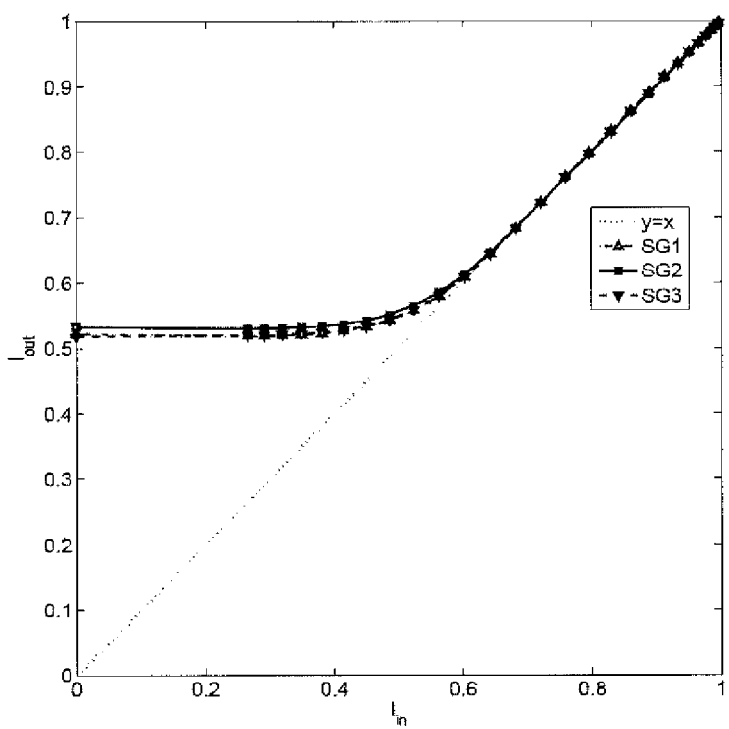
FIG. 21 illustrates the EXIT curves of the functions $f_{SGi}$, $i=1, \ldots 3$.

As discussed before, also the semi-Gaussian approach can be used to optimize the system parameters in the different fading points. Just as with the all-Gaussian approach, the degree distributions $\lambda(x)$ are derived so that the tunnel (this time between the EXIT curves and the bisector) remains open for the worst possible channel conditions. The result (FIG. 21) suggests that worse channel conditions would mean that the tunnel would close. This method leads to same WER performance as the all-Gaussian approach.

Figure 22:
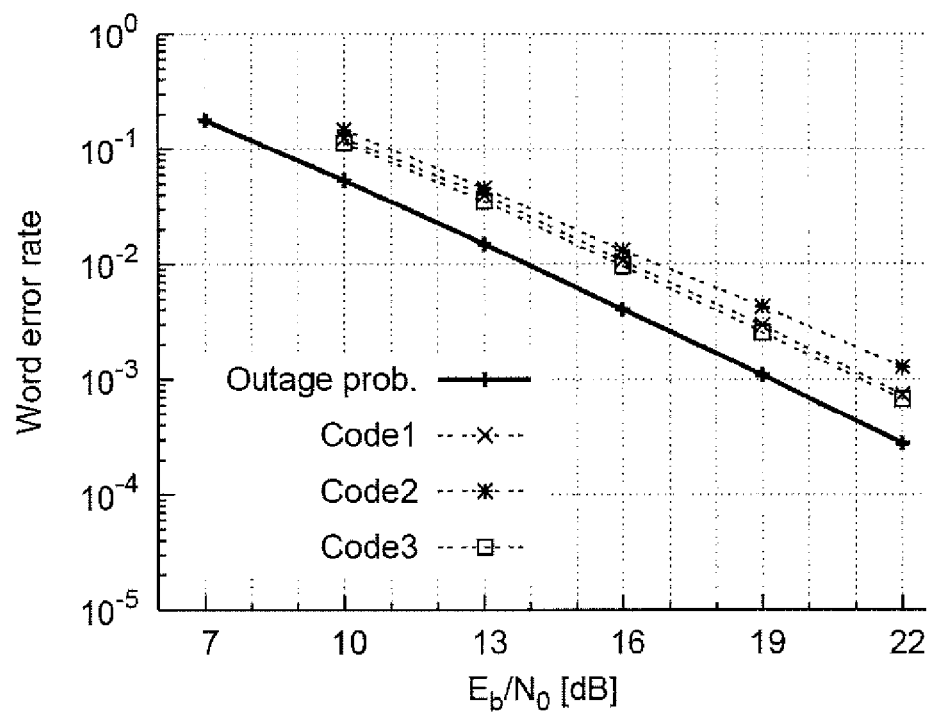
FIG. 22 illustrates the WER performance of prior art implementations on the block fading channel with two fading gains.

Some numerical results are provided to illustrate the benefit the solution of the invention brings. FIG. 22 first shows some results obtained with the prior art solution. As no specific labelling for multidimensional modulations on BF channels has been proposed, standard labelling techniques are considered: Gray labelling and Ungerboeck labelling. In Gray labelling, the label of each point of the constellation differs from its neighbours only in one bit. Ungerboeck labelling partitions the constellation such that each bit has a different level of protection. The following scenarios have been simulated:
1) Code1: $\Omega_x$=rotated 4-QAM, $\theta$=27, Ungerboeck labelling, irregular LDPC code
2) Code2: $\Omega_x$=rotated 8-QAM, $\theta$=0, Ungerb. labelling, regular (4,10) LDPC code
3) Code3: $\Omega_x$=rotated 8-QAM, $\theta$=0, Gray labelling, irregular LDPC code The WER curves are compared to the outage probability of the rotated 8-QAM modulation (FIG. 22). The gap to the outage probability varies from 2 dB to 3 dB. Comparing the WER performance of Code2 and Code3, it can be seen that rotated 8-QAM can perform worse than rotated 4-QAM, depending on the parameters of the code and the labelling, although its corresponding outage probability is smaller than the outage probability of rotated 4-QAM.

Now the results obtained with the solution of the invention are presented. Again a system is considered wherein communication over a block fading channel is performed with B=2 blocks. The spectral efficiency is R=0.9 bpcu. A comparison with the best code from the prior art, i.e., Code3, will be made. The block length of the simulated codes is N=5000, but the results are valid for a large interval of block lengths. The effect of the labelling is illustrated by using the same irregular LDPC code as Code3, but using optimal labelling. Next, the coding gain is improved by using optimized degree distributions of the LDPC code.

Figure 23:
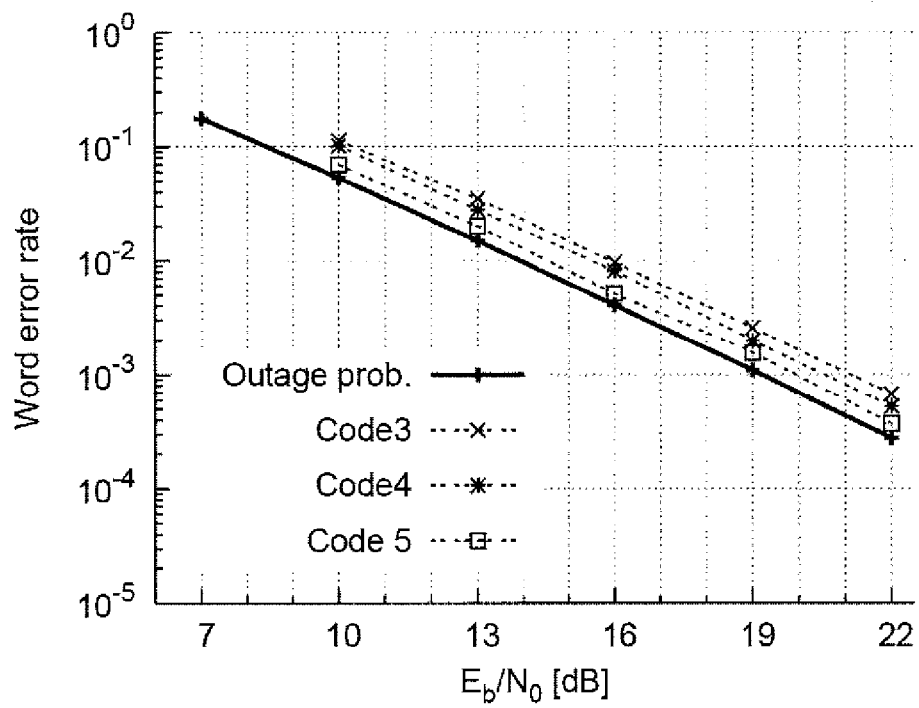
FIG. 23 illustrates the WER performance of the proposed techniques compared to prior art implementations on the BF channel with two fading gains.

The following scenarios are compared:
1) Code3: $\Omega_x$=rotated 8-QAM, $\theta$=0, Gray labelling, irregular LDPC code
2) Code4: $\Omega_x$=rotated 8-QAM, $\theta$=8.6, optimal labelling, irregular LDPC code
3) Code5: $\Omega_x$=rotated 8-QAM, $\theta$=8.6, optimal labelling, optimal LDPC code The WER curves are compared to the minimized outage probability of the rotated 8-QAM-modulation (FIG. 23). The gap to the outage probability is decreased to 0.5 dB.

Innovating in this invention is the design of the mapping and the coding scheme in the fading space, which is the real space of fading coefficients. The outage probability corresponds to the probability that the fading gains belong to a volume defined in this space, which is limited by the outage boundary. Similarly, the word error rate corresponds to another volume in this space which is limited by the code boundary. The invention capitalizes on the observation that the code and the mapping must be optimized for one or more points in the fading space so that the randomness of the fading gains is accounted for and that the optimization at least concerns the degree distributions of a parity-check matrix of the considered LDPC code ensemble. The LDPC code and the mapping are designed in the fading space such that the code boundary approaches as much as possible the outage boundary. Known techniques can be applied for performing the optimization in the specified points.

A major advantage of the proposed solution is that a same word error rate performance (quality of transmission) for a certain spectral efficiency can be achieved with less transmitted energy per information bit. The actual gain depends on the channel parameters.

By way of example the following channel is considered for a case where linear precoding is applied. The transmitter has one transmit antenna and the receiver has one receive antenna. The number of independent fading gains affecting a packet of transmitted symbols is B=2. The spectral efficiency is 0.9 information bits per channel use. With this channel, a gain of 1.5 to 2 dB compared to the best known prior art solution can be obtained by the techniques according to the present invention. Here, it is assumed that known techniques use the techniques from the Duyck paper which improve the outage probability. Otherwise, the gain with respect to the prior art is even larger. A performance improvement of 2 dB means that with the present invention, the transmitter will only use 2/3d of the power that would be needed without our techniques. Alternatively, for the same power, a better quality of transmission (the error rate is 70% of the error rate using the best prior art techniques) or a larger spectral efficiency (higher transmission rate) can be obtained. This gain can be larger if larger spectral efficiencies or multiple-antenna systems are used.

Although the present invention has been illustrated by reference to specific embodiments, it will be apparent to those skilled in the art that the invention is not limited to the details of the foregoing illustrative embodiments, and that the present invention may be embodied with various changes and modifications without departing from the scope thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. In other words, it is contemplated to cover any and all modifications, variations or equivalents that fall within the scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

The invention claimed is:

1. A method for optimising a coded modulation scheme with a given spectral efficiency for communication over a fading channel represented by B fading gains, B being an integer number expressing the ratio between a code word duration and the duration over which the fading remains constant, said fading gains forming components of a fading point belonging to a B-dimensional space of fading gains, the method comprising:
    selecting a coded modulation scheme having a coding rate, $R_c$, and comprising a mapping with a modulation rate, $R_m$, in accordance with said spectral efficiency,
    choosing a constellation in accordance with said modulation rate, $R_m$,
    labelling said constellation,
    selecting a low-density parity check code type represented by a plurality of code parameters, determining for said constellation and said labelling said code parameters in accordance with said coding rate, $R_c$, thereby at least optimizing the degree distributions of a parity-check matrix by means of extrinsic information transfer (EXIT) charts or density evolution, so that the code boundary is optimized in said B-dimensional space of fading gains in one or more fading points corresponding to one or more fading points on a lower bound where the mutual information between input and output of said fading channel equals said spectral efficiency, at least one of said fading points having at least two different components, wherein said code boundary approaches said lower bound and whereby at least one specific instance of said low-density parity check code is obtained, and applying said at least one specific instance of said low-density parity check code for communication over said fading channel.

2. The method as in claim 1, wherein said mapping is a multidimensional mapping, whereby $R_m \cdot B$ coded bits are mapped to a B-dimensional symbol and whereby interleaving is applied on components of said B-dimensional symbol.

3. The method as in claim 2, further comprising a step of optimising said labelling by maximizing a minimum of mutual information values in said one or more fading points.

4. The method as in claim 3, whereby said labelling step comprises a step of segmenting the constellation points in correspondence with said one or more fading points in clusters and performing a partial labelling whereby a same bit combination is assigned to all points of a same cluster.

5. The method as in claim 2, wherein said multidimensional mapping comprises a linear precoding step.

6. The method as in claim 5, comprising a step of optimizing a rotation angle applied in said linear precoding step by performing a maximization of a minimum of mutual information values.

7. The method as in claim 1, whereby the step of determining said code parameters is performed in B+1 fading points.

8. The method as in claim 7, whereby said B+1 fading points comprise B fading points on the B axes of said B-dimensional space of fading gains.

9. The method as in claim 1, wherein the step of determining said code parameters is performed by means of extrinsic information transfer charts.

10. The method as in claim 1, further comprising a step of determining a specific instance of said parity check matrix.

11. The method as in claim 10, wherein the determined specific instance is so selected that it is avoided that information bits belong to a stopping set consisting of bits of which the transmission is affected by a single fading gain of said B fading gains, said stopping set being a subset of variable nodes of said specific instance whereby all check nodes connected to said subset are at least twice connected to said subset.

12. A transmitter device for use in communication over a fading channel according to a coded modulation scheme having a coding rate, $R_c$, and a modulation rate, $R_m$, in accordance with given spectral efficiency, said fading channel represented by B fading gains, B being an integer number expressing the ratio between a code word duration and the duration over which the fading remains constant, said fading gains forming components of a fading point belonging to a B-dimensional space of fading gains, said transmitter device comprising:

an encoder means arranged to encode applied information bits with a low-density parity check code having code parameters, and a modular means arranged to map coded bits output by said encoder to symbols of a constellation chosen in accordance with said modulation rate, said constellation being labelled, the code parameters of said low-density parity check code being determined for said constellation and said labelling in accordance with said coding rate, wherein at least degree distributions in a parity-check matrix of said low-density parity check code are optimized by means of extrinsic information transfer (EXIT) charts or density evolution, so that the code boundary is optimized in said B-dimensional space of fading gains in one or more fading points corresponding to one or more fading points on a lower bound where the mutual information between input and output of said fading channel equals said spectral efficiency, at least one of said fading points having at least two different components, whereby said code boundary approaches said lower bound.

13. The transmitter device as in claim 12, further comprising coding means for performing a linear precoding.

14. A communication system comprising the transmitter device as in claim 12.

* * * * *